(12) United States Patent
Wenzel et al.

(10) Patent No.: US 10,088,814 B2
(45) Date of Patent: *Oct. 2, 2018

(54) SYSTEM IDENTIFICATION AND MODEL DEVELOPMENT

(71) Applicant: Johnson Controls Technology Company, Holland, MI (US)

(72) Inventors: Michael J. Wenzel, Oak Creek, WI (US); Robert D. Turney, Watertown, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 373 days.

This patent is subject to a terminal disclaimer.

(21) Appl. No.: 14/970,187

(22) Filed: Dec. 15, 2015

(65) Prior Publication Data

US 2016/0098022 A1  Apr. 7, 2016

Related U.S. Application Data

(63) Continuation of application No. 13/802,233, filed on Mar. 13, 2013, now Pat. No. 9,235,657.

(51) Int. Cl.
*G06F 17/50* (2006.01)
*G05B 13/02* (2006.01)

(52) U.S. Cl.
CPC ......... *G05B 13/0265* (2013.01); *G06F 17/50* (2013.01)

(58) Field of Classification Search
CPC .............................. G05B 13/0265; G06F 17/50
USPC .......................................................... 703/13
See application file for complete search history.

(56) References Cited

U.S. PATENT DOCUMENTS

| | | |
|---|---|---|
| 4,061,185 A | 12/1977 | Faiczak |
| 4,349,869 A | 9/1982 | Prett et al. |
| 4,616,308 A | 10/1986 | Morshedi et al. |
| 5,289,362 A | 2/1994 | Liebl et al. |
| 5,301,101 A | 4/1994 | MacArthur et al. |
| 5,347,446 A | 9/1994 | Iino et al. |
| 5,351,184 A | 9/1994 | Lu et al. |

(Continued)

OTHER PUBLICATIONS

RAP.org, Time-Varying and Dynamic Rate Design, published by www.raponline.org on Jul. 2012.

(Continued)

*Primary Examiner* — Dwin M Craig
(74) *Attorney, Agent, or Firm* — Foley & Lardner LLP

(57) ABSTRACT

A controller for a building system receives training data that includes input data and output data. The output data measures a state of the building system affected by both the input data and an extraneous disturbance. The controller performs a two-stage optimization process to identify system parameters and Kalman gain parameters of a dynamic model for the building system. During the first stage, the controller filters the training data to remove an effect of the extraneous disturbance from the output data and uses the filtered training data to identify the system parameters. During the second stage, the controller uses the non-filtered training data to identify the Kalman gain parameters. The controller uses the dynamic model with the identified system parameters and Kalman gain parameters to generate a setpoint for the building system. The building system uses the setpoint to affect the state measured by the output data.

20 Claims, 6 Drawing Sheets

(56) References Cited

U.S. PATENT DOCUMENTS

| | | |
|---|---|---|
| 5,408,406 A | 4/1995 | Mathur et al. |
| 5,442,544 A | 8/1995 | Jelinek |
| 5,519,605 A | 5/1996 | Cawlfield |
| 5,572,420 A | 11/1996 | Lu |
| 5,924,486 A | 7/1999 | Ehlers et al. |
| 6,055,483 A | 4/2000 | Lu |
| 6,122,555 A | 9/2000 | Lu |
| 6,141,595 A | 10/2000 | Gloudeman et al. |
| 6,167,389 A | 12/2000 | Davis |
| 6,278,899 B1 | 8/2001 | Piche et al. |
| 6,347,254 B1 | 2/2002 | Lu |
| 6,385,510 B1 | 5/2002 | Hoog et al. |
| 6,459,939 B1 | 10/2002 | Hugo |
| 6,574,581 B1 | 6/2003 | Bohrer et al. |
| 6,577,962 B1 | 6/2003 | Afshari |
| 6,785,592 B1 | 8/2004 | Smith et al. |
| 6,807,510 B1 | 10/2004 | Backstrom et al. |
| 6,934,931 B2 | 8/2005 | Plumer et al. |
| 6,976,366 B2 | 12/2005 | Starling et al. |
| 7,039,475 B2 | 5/2006 | Sayyarrodsari et al. |
| 7,050,863 B2 | 5/2006 | Mehta et al. |
| 7,050,866 B2 | 5/2006 | Martin et al. |
| 7,069,161 B2 | 6/2006 | Gristina et al. |
| 7,152,023 B2 | 12/2006 | Das |
| 7,165,399 B2 | 1/2007 | Stewart |
| 7,188,779 B2 | 3/2007 | Alles |
| 7,197,485 B2 | 3/2007 | Fuller |
| 7,203,554 B2 | 4/2007 | Fuller |
| 7,266,416 B2 | 9/2007 | Gallestey et al. |
| 7,272,454 B2 | 9/2007 | Wojsznis et al. |
| 7,274,975 B2 | 9/2007 | Miller |
| 7,275,374 B2 | 10/2007 | Stewart et al. |
| 7,328,074 B2 | 2/2008 | Das et al. |
| 7,328,577 B2 | 2/2008 | Stewart et al. |
| 7,376,471 B2 | 5/2008 | Das et al. |
| 7,376,472 B2 | 5/2008 | Wojsznis et al. |
| 7,389,773 B2 | 6/2008 | Stewart et al. |
| 7,400,933 B2 | 7/2008 | Rawlings et al. |
| 7,418,372 B2 | 8/2008 | Nishira et al. |
| 7,454,253 B2 | 11/2008 | Fan |
| 7,496,413 B2 | 2/2009 | Fan et al. |
| 7,565,227 B2 | 7/2009 | Richard et al. |
| 7,577,483 B2 | 8/2009 | Fan et al. |
| 7,591,135 B2 | 9/2009 | Stewart |
| 7,599,897 B2 | 10/2009 | Hartman et al. |
| 7,610,108 B2 | 10/2009 | Boe et al. |
| 7,650,195 B2 | 1/2010 | Fan et al. |
| 7,668,671 B1 | 2/2010 | Gristina |
| 7,676,283 B2 | 3/2010 | Liepold et al. |
| 7,826,909 B2 | 11/2010 | Attarwala |
| 7,844,352 B2 | 11/2010 | Vouzis et al. |
| 7,848,900 B2 | 12/2010 | Steinberg et al. |
| 7,856,281 B2 | 12/2010 | Thiele et al. |
| 7,878,178 B2 | 2/2011 | Stewart et al. |
| 7,894,943 B2 | 2/2011 | Sloup et al. |
| 7,908,117 B2 | 3/2011 | Steinberg et al. |
| 7,930,045 B2 | 4/2011 | Cheng |
| 7,945,352 B2 | 5/2011 | Koc |
| 7,949,416 B2 | 5/2011 | Fuller |
| 7,987,145 B2 | 7/2011 | Baramov |
| 7,996,140 B2 | 8/2011 | Stewart et al. |
| 8,005,575 B2 | 8/2011 | Kirchhof |
| 8,019,701 B2 | 9/2011 | Sayyar-Rodsari et al. |
| 8,032,235 B2 | 10/2011 | Sayyar-Rodsari |
| 8,036,758 B2 | 10/2011 | Lu et al. |
| 8,046,089 B2 | 10/2011 | Renfro et al. |
| 8,060,290 B2 | 11/2011 | Stewart et al. |
| 8,073,659 B2 | 12/2011 | Gugaliya et al. |
| 8,078,291 B2 | 12/2011 | Pekar et al. |
| 8,086,352 B1 | 12/2011 | Elliott |
| 8,105,029 B2 | 1/2012 | Egedal et al. |
| 8,109,255 B2 | 2/2012 | Stewart et al. |
| 8,121,818 B2 | 2/2012 | Gorinevsky |
| 8,126,575 B2 | 2/2012 | Attarwala |
| 8,145,329 B2 | 3/2012 | Pekar et al. |
| 8,145,361 B2 | 3/2012 | Forbes et al. |
| 8,172,153 B1 | 5/2012 | Kennedy et al. |
| 8,180,493 B1 | 5/2012 | Laskow |
| 8,185,217 B2 | 5/2012 | Thiele |
| 8,200,346 B2 | 6/2012 | Thiele |
| 8,335,596 B2 | 12/2012 | Raman et al. |
| 8,417,391 B2 | 4/2013 | Rombouts et al. |
| 8,443,071 B2 | 5/2013 | Lu et al. |
| 8,548,638 B2 | 10/2013 | Roscoe et al. |
| 8,600,561 B1 | 12/2013 | Modi et al. |
| 8,720,791 B2 | 5/2014 | Slingsby et al. |
| 8,751,432 B2 | 6/2014 | Berg-Sonne et al. |
| 8,768,527 B2 | 7/2014 | Tomita et al. |
| 8,825,219 B2 | 9/2014 | Gheerardyn et al. |
| 8,862,280 B1 | 10/2014 | Dyess et al. |
| 8,886,361 B1 | 11/2014 | Harmon et al. |
| 8,903,560 B2 | 12/2014 | Miller |
| 9,146,548 B2 | 9/2015 | Chambers et al. |
| 9,235,657 B1 | 1/2016 | Wenzel et al. |
| 9,261,863 B2 | 2/2016 | Sloop et al. |
| 9,436,179 B1 | 9/2016 | Turney et al. |
| 9,448,550 B2 | 9/2016 | Ha |
| 2003/0009401 A1 | 1/2003 | Ellis |
| 2004/0095237 A1 | 5/2004 | Chen et al. |
| 2004/0117330 A1 | 6/2004 | Ehlers et al. |
| 2004/0128266 A1 | 7/2004 | Yellepeddy et al. |
| 2004/0215529 A1 | 10/2004 | Foster et al. |
| 2005/0027494 A1* | 2/2005 | Erdogmus .............. G05B 13/04 703/2 |
| 2005/0096797 A1 | 5/2005 | Matsubara et al. |
| 2005/0173865 A1 | 8/2005 | Hochfeld |
| 2005/0194456 A1 | 9/2005 | Tessier et al. |
| 2005/0203761 A1 | 9/2005 | Barr et al. |
| 2006/0161450 A1 | 7/2006 | Carey et al. |
| 2006/0259199 A1 | 11/2006 | Gjerde et al. |
| 2006/0276938 A1 | 12/2006 | Miller |
| 2007/0203860 A1 | 8/2007 | Golden et al. |
| 2007/0213880 A1 | 9/2007 | Ehlers |
| 2007/0276547 A1 | 11/2007 | Miller |
| 2008/0010521 A1 | 1/2008 | Goodrum et al. |
| 2008/0083234 A1 | 4/2008 | Krebs et al. |
| 2009/0001180 A1 | 1/2009 | Siddaramanna et al. |
| 2009/0005912 A1* | 1/2009 | Srivastava ........... G05B 13/044 700/276 |
| 2009/0048717 A1 | 2/2009 | Richard et al. |
| 2009/0171862 A1 | 7/2009 | Harrod et al. |
| 2009/0216382 A1 | 8/2009 | Ng |
| 2010/0013863 A1 | 1/2010 | Harris |
| 2010/0106332 A1 | 4/2010 | Chassin et al. |
| 2010/0141046 A1 | 6/2010 | Paik |
| 2010/0204845 A1 | 8/2010 | Ohuchi et al. |
| 2010/0235004 A1 | 9/2010 | Thind |
| 2010/0244571 A1 | 9/2010 | Spitaels et al. |
| 2010/0262313 A1 | 10/2010 | Chambers et al. |
| 2010/0269854 A1 | 10/2010 | Barbieri et al. |
| 2010/0286937 A1 | 11/2010 | Hedley et al. |
| 2010/0289643 A1 | 11/2010 | Trundle et al. |
| 2010/0324962 A1 | 12/2010 | Nesler et al. |
| 2010/0332373 A1 | 12/2010 | Crabtree et al. |
| 2011/0022193 A1 | 1/2011 | Panaitescu |
| 2011/0046792 A1 | 2/2011 | Imes et al. |
| 2011/0060424 A1 | 3/2011 | Havlena |
| 2011/0106327 A1 | 5/2011 | Zhou et al. |
| 2011/0106328 A1 | 5/2011 | Zhou et al. |
| 2011/0125293 A1 | 5/2011 | Havlena |
| 2011/0153090 A1 | 6/2011 | Besore et al. |
| 2011/0160913 A1 | 6/2011 | Parker et al. |
| 2011/0178977 A1 | 7/2011 | Drees |
| 2011/0184564 A1 | 7/2011 | Amundson et al. |
| 2011/0184565 A1 | 7/2011 | Peterson |
| 2011/0202185 A1 | 8/2011 | Imes et al. |
| 2011/0202193 A1 | 8/2011 | Craig et al. |
| 2011/0218691 A1 | 9/2011 | O'Callaghan et al. |
| 2011/0231320 A1 | 9/2011 | Irving |
| 2011/0238224 A1 | 9/2011 | Schnell et al. |
| 2011/0257789 A1 | 10/2011 | Stewart et al. |
| 2011/0257911 A1 | 10/2011 | Drees et al. |
| 2011/0290893 A1 | 12/2011 | Steinberg |
| 2011/0301723 A1 | 12/2011 | Pekar et al. |

(56) References Cited

U.S. PATENT DOCUMENTS

| | | |
|---|---|---|
| 2012/0016524 A1 | 1/2012 | Spicer et al. |
| 2012/0053740 A1 | 3/2012 | Venkatakrishnan et al. |
| 2012/0053741 A1 | 3/2012 | Beyerle et al. |
| 2012/0053745 A1 | 3/2012 | Ng |
| 2012/0059351 A1 | 3/2012 | Nordh |
| 2012/0060505 A1 | 3/2012 | Fuller et al. |
| 2012/0065805 A1 | 3/2012 | Montalvo |
| 2012/0084063 A1 | 4/2012 | Drees et al. |
| 2012/0109394 A1 | 5/2012 | Takagi et al. |
| 2012/0109620 A1 | 5/2012 | Gaikwad et al. |
| 2012/0116546 A1 | 5/2012 | Sayyar-Rodsari |
| 2012/0125559 A1* | 5/2012 | Fadell .................. F24F 11/0012 165/11.2 |
| 2012/0130924 A1 | 5/2012 | James |
| 2012/0150707 A1 | 6/2012 | Campbell et al. |
| 2012/0209442 A1 | 8/2012 | Ree |
| 2012/0232701 A1 | 9/2012 | Carty et al. |
| 2012/0259469 A1 | 10/2012 | Ward et al. |
| 2012/0278221 A1 | 11/2012 | Fuller et al. |
| 2012/0296799 A1 | 11/2012 | Playfair et al. |
| 2012/0310416 A1 | 12/2012 | Tepper et al. |
| 2012/0316695 A1 | 12/2012 | Chen et al. |
| 2012/0330465 A1 | 12/2012 | O'Neill et al. |
| 2012/0330671 A1 | 12/2012 | Fan et al. |
| 2013/0013119 A1 | 1/2013 | Mansfield et al. |
| 2013/0013121 A1 | 1/2013 | Henze et al. |
| 2013/0013124 A1 | 1/2013 | Park et al. |
| 2013/0024029 A1 | 1/2013 | Tran et al. |
| 2013/0060391 A1 | 3/2013 | Deshpande et al. |
| 2013/0066571 A1 | 3/2013 | Chamarti et al. |
| 2013/0085614 A1 | 4/2013 | Wenzel et al. |
| 2013/0090777 A1 | 4/2013 | Lu et al. |
| 2013/0110299 A1 | 5/2013 | Meyerhofer et al. |
| 2013/0123996 A1 | 5/2013 | Matos |
| 2013/0184892 A1 | 7/2013 | Mohan et al. |
| 2013/0190940 A1 | 7/2013 | Sloop et al. |
| 2013/0204439 A1 | 8/2013 | Scelzi |
| 2013/0226316 A1 | 8/2013 | Duchene et al. |
| 2013/0231792 A1 | 9/2013 | Ji et al. |
| 2013/0238157 A1 | 9/2013 | Luke et al. |
| 2013/0245847 A1 | 9/2013 | Steven et al. |
| 2013/0268126 A1 | 10/2013 | Iwami et al. |
| 2013/0308674 A1 | 11/2013 | Kramer et al. |
| 2013/0311793 A1 | 11/2013 | Chang |
| 2013/0325377 A1 | 12/2013 | Drees et al. |
| 2013/0340450 A1 | 12/2013 | Ashrafzadeh et al. |
| 2013/0345880 A1 | 12/2013 | Asmus |
| 2014/0067132 A1 | 3/2014 | Macek et al. |
| 2014/0094979 A1 | 4/2014 | Mansfield |
| 2014/0128997 A1 | 5/2014 | Holub et al. |
| 2014/0148953 A1 | 5/2014 | Nwankpa et al. |
| 2014/0203092 A1 | 7/2014 | Broniak et al. |
| 2014/0222396 A1 | 8/2014 | Wen et al. |
| 2014/0229016 A1 | 8/2014 | Shiflet |
| 2014/0229026 A1 | 8/2014 | Cabrini |
| 2014/0316973 A1 | 10/2014 | Steven et al. |
| 2014/0379099 A1 | 12/2014 | Premereur et al. |
| 2015/0105918 A1 | 4/2015 | Lee |
| 2015/0142179 A1 | 5/2015 | Ito et al. |
| 2015/0192317 A1 | 7/2015 | Asmus |
| 2015/0276253 A1 | 10/2015 | Montalvo |
| 2016/0195866 A1 | 7/2016 | Turney et al. |

OTHER PUBLICATIONS

Office Action for U.S. Appl. No. 13/802,154, dated Mar. 31, 2017, 7 pages.

Notice of Allowance for U.S. Appl. No. 13/802,154 dated Aug. 24, 2017, 13 pages.

Faruqui et al., (RAP), "Time-Varying and Dynamic Rate Design" published by www.raponline.org on Jul. 2012, entire document, 52 pages.

Goyal et al, Occupancy-Based Zone-Climate Control for Energy-Efficient Buildings: Complexity vs. Performance, Department of Mechanical and Aerospace Engineering, University of Florida, Aug. 3, 2012, 31 pages.

Non-Final Office Action on U.S. Appl. No. 13/802,154 dated Oct. 7, 2015, 19 pages.

Non-Final Office Action on U.S. Appl. No. 13/802,279 dated Jun. 29, 2015, 11 pages.

Non-Final Office Action on U.S. Appl. No. 13/802,233 dated Apr. 10, 2015, 15 pages.

Notice of Allowance on U.S. Appl. No. 13/802,233 dated Sep. 10, 2015, 9 pages.

Qin et al., A survey of industrial model predictive control technology, Control Engineering Practices II, 2003, pp. 733-764.

Rawlings, James B., Tutorial Overview of Model Predictive Control, IEEE Control Systems Magazine, Jun. 2000, pp. 38-52.

Wan et al., The Unscented Kalman Filter for Nonlinear Estimation, IEEE 2000, pp. 153-158.

U.S. Notice of Allowance on U.S. Appl. No. 15/068,470 dated Apr. 20, 2018. 5 pages.

U.S. Office Action on U.S. Appl. No. 15/068,470 dated Dec. 1, 2017. 6 pages.

\* cited by examiner

SYSTEM IDENTIFICATION AND MODEL DEVELOPMENT

CROSS-REFERENCE TO RELATED PATENT APPLICATION

This application is a continuation of U.S. patent application Ser. No. 13/802,233, filed Mar. 13, 2013, and granted as U.S. Pat. No. 9,235,657 Jan. 12, 2016, the entirety of which is incorporated by reference herein.

BACKGROUND

The present disclosure relates to systems methods for system identification and recursive adaptation. The systems and methods described herein may be used to identify dynamic systems for use in model predictive control systems such as those sold by Johnson Controls, Inc.

The model is arguably the most important part of a control system. It is with the model that the controller predicts future system states and system outputs to determine optimal control actions. Without an accurate model, control actions may be suboptimal and possibly even unstable.

System identification is the process of determining a system of equations (e.g., a system model) that allow for the prediction of future system states or system outputs. System identification may be performed using "black-box" methods such as an ARMAX model or "gray-box" physics-based parameterizations of the system. In either case, the predicted output may be based the input-output history of the system.

Traditional system identification methods suffer from several disadvantages. First, traditional methods are based on the assumption of a linear model, which is often an inaccurate representation of the system. Even in the event that a system does behave linearly, there is still the problem of actuator saturation which occurs when a setpoint is stepped up by a large amount and the output begins to float. Additionally, traditional methods require long training periods of two days or more and may require additional training to adjust the model to a changing physical system.

A system identification method is needed which quickly and accurately identifies system parameters, which distinguishes between external disturbances to the system and changes to the system itself, and which adapts the model parameters to a changing physical system without needing to redevelop or retrain the model.

SUMMARY

One implementation of the present disclosure is a method identifying model parameters in a system model including receiving training data including input data and output data, filtering the training data to remove extraneous disturbances, using the system model to generate a model-predicted filtered output based on the filtered input data and a set of estimated model parameters, receiving a first error cost function based on the difference between the filtered output data and the model-predicted filtered output, and using a first optimization procedure to optimize the estimated model parameters. The input data may represent one or more inputs applied to a system and the output data may represent one or more outputs of the system. The estimated model parameters may be optimized to minimize the first error cost function.

In some embodiments, the method further includes using the system model to generate a model-predicted non-filtered output based on the input data and the optimized estimated model parameters, receiving a second error cost function based on the difference between the output data and the model-predicted non-filtered output, and using a second optimization procedure to optimize a set of Kalman gain parameters. The Kalman gain parameters may be optimized to minimize the second error cost function. The second optimization procedure may optimize the Kalman gain parameters while holding the system parameters at constant values the system parameters may be held at the optimized values determined by the first optimization procedure.

In some embodiments, the method further includes receiving a new data point including new input data and new output data, adding the new data point to the training data, and repeating the 'filtering' and 'using' steps to update the system parameters and Kalman gain parameters in response to the new data point.

In some embodiments, the system may be a building system and the system model may be an energy model for the building system. The training data may be filtered using a high-pass filter to remove a slowly changing disturbance to the system.

In some embodiments, the system model may be an inner loop system model for an inner loop of a cascaded model predictive control system or an outer loop system model for an outer loop of a cascaded model predictive control system. The system model may be a linear state space model with a parameterized Kalman gain or a physics-based parameterization of the system.

In some embodiments, the first error cost function may be configured to mitigate the effect of a filtered output estimation error exceeding a first threshold and the second cost function may be configured to mitigate the effect of non-filtered output estimation errors that exceed a second threshold. The filtered output estimation error may be defined as the difference between the filtered output data and the model-predicted filtered output and the non-filtered output estimation error may be defined as the difference between the output data and the model-predicted non-filtered output.

Another implementation of the present disclosure is a method of recursively identifying model parameters in a system model including receiving a set of model parameters including system parameters and Kalman gain parameters, estimating updated model parameters upon receiving a new data measurement, checking the estimated model parameters for stability and robustness, and either using the updated model parameters to estimate system states if the updated model parameters are stable and robust reverting to previous model parameters if the updated model parameters are unstable or non-robust.

In some embodiments, the system model may be a linear state space model with a parameterized Kalman gain and the updated model parameters may be determined to be stable if the eigenvalues of A-KC are strictly less than one, A and C corresponding the A and C matrices respectively in the linear state space model and K corresponding to the parameterized Kalman gain.

In some embodiments, the updated model parameters may be determined to be robust if the difference between a model-predicted output based on the updated model parameters and a set of inputs to the system and an actual system output is within a threshold. In some embodiments, the model parameters are estimated using an extended Kalman filter and the system states are estimated using a Kalman gain.

Another implementation of the present disclosure is a method of developing an energy model for a building system including formulating a system of equations to express future system states and system outputs as a function of current system states and system inputs, accounting for disturbances to the system using a parameterized Kalman gain, developing a framework energy model using physical principles to describe energy characteristics of the building system in terms of undefined system parameters, and using a system identification process to obtain system parameters for the framework energy model.

In some embodiments, the system identification process in the model development method may include receiving training data including input data representing one or more inputs applied to a system and output data representing one or more outputs of the system, filtering the training data to remove extraneous disturbances, using the system model to generate a model-predicted filtered output based on the filtered input data and a set of estimated model parameters, receiving a first error cost function based on the difference between the filtered output data and the model-predicted filtered output, and using a first optimization procedure to optimize the estimated model parameters. The estimated model parameters may be optimized to minimize the first error cost function.

In some embodiments, the system identification process may further include using the system model to generate a model-predicted non-filtered output based on the input data and the optimized estimated model parameters, receiving a second error cost function based on the difference between the output data and the model-predicted non-filtered output, and using a second optimization procedure to optimize a set of Kalman gain parameters. The Kalman gain parameters may be optimized to minimize the second error cost function and may be optimized while holding the system parameters at the optimized values determined by the first optimization procedure.

DETAILED DESCRIPTION

The systems and methods described herein may be used to develop a model for a system (e.g., a heat transfer model for a building system) and identify system parameters (e.g. heat transfer characteristics of the building system) for the system model. The exemplary embodiment describes the model development process and the system identification process in the context of a heat transfer model for a building system. However, the systems and methods described herein may be applied to a wide variety of systems including heating and cooling systems, ventilation and air conditioning systems, electrical systems, plumbing and water systems, data and information systems, security systems, and any other suitable system.

Physical principles (e.g., heat transfer principles, electrical principles, kinematic principles, etc.) may be used to develop the system model in terms of undefined system parameters. The present disclosure refers to such an unidentified model as a "framework model" for the system. A system identification process may then be used to identify the system parameters in the framework model. The system identification process may be an offline batch identification process using a set of previously recorded training data (e.g., data relating to system inputs and system outputs over a defined time period) or an online recursive identification process which adaptively identifies the system parameters each time a new measurement (e.g., a measurement or estimation of system states or system outputs) is received.

Once system parameters have been identified, the system model may be used in a control system (e.g., a model predictive control system, a PID control system, etc.) to regulate one or more variable system states. For example, in the exemplary embodiment, the identified system model may be used to control the temperature of a building system (e.g., maintain the building temperature within specified bounds) while minimizing the cost of energy required to heat or cool the building.

Figure 1:
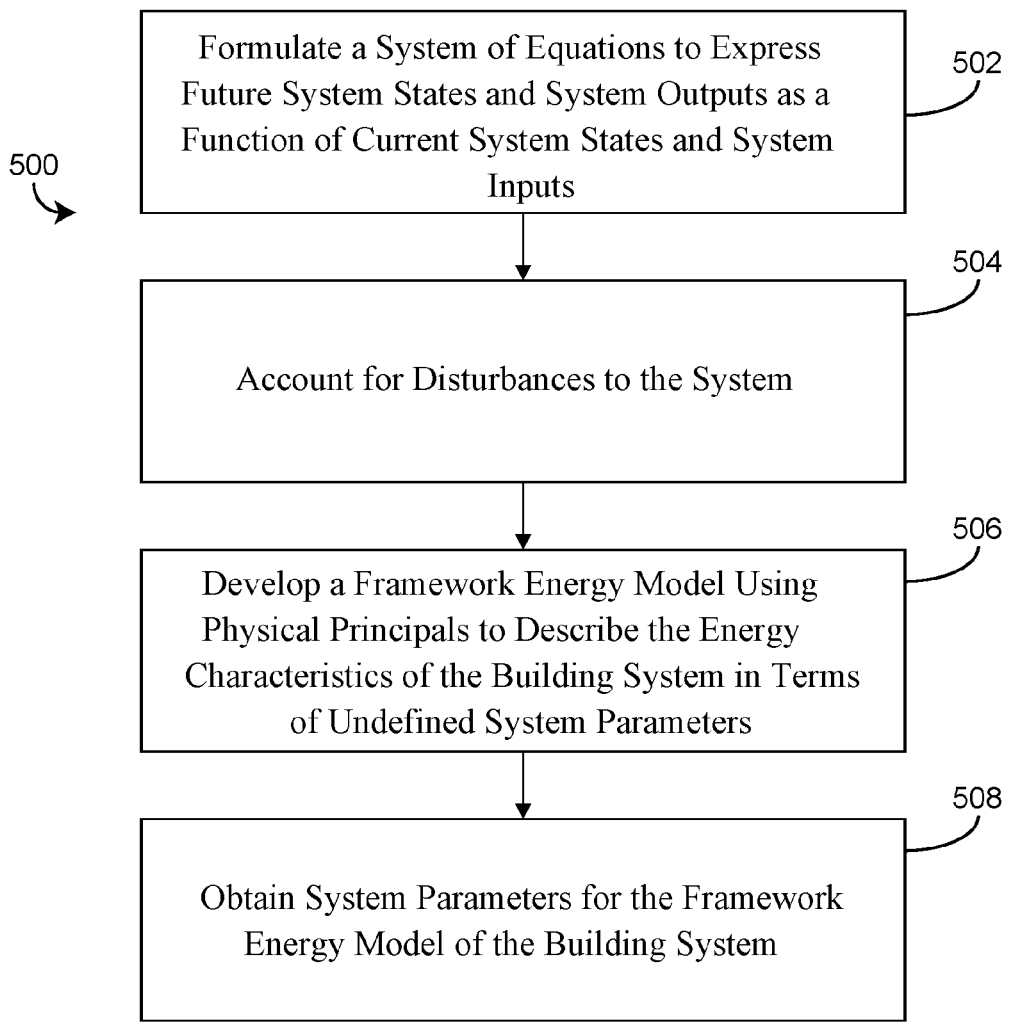
FIG. 1 is a flowchart of a process for developing a framework energy model for a building system and obtaining system parameters for the framework energy model, according to an exemplary embodiment, according to an exemplary embodiment.

Referring now to FIG. 1, a flowchart illustrating a process 500 to develop an energy model for a building system is shown, according to an exemplary embodiment. Process 500 may include formulating a system of equations to express future system states and system outputs (e.g., future building temperature, future power use, etc.) as a function of current system states (e.g., current building temperature, current power use, etc.) and controllable inputs to the system (e.g., a power setpoint, a temperature setpoint, or other manipulated variables) (step 502). Process 500 may further include accounting for disturbances to the system (e.g., factors other than controllable inputs) such as outside temperature or weather conditions that may affect future system states and system outputs (step 504). Additionally, process 500 may include developing a framework model using physical principles to describe the energy characteristics of the building system in terms of undefined system parameters (step 506), and obtaining system parameters for the framework model (step 508).

Still referring to FIG. 1, process 500 may include formulating a system of equations to express future system states and system outputs as a function of current system states and controllable system inputs (step 502). In an exemplary embodiment, a state space representation is used to express future system states and system outputs in discrete time as a function current system states and inputs to the system 502. However, step 502 may include formulating any type of equation (e.g., linear, quadratic, algebraic, trigonometric, differential, etc.) to express future system states. In the example embodiment, a state space modeling representation may be expressed in discrete time as:

$$x(k+1)=Ax(k)+Bu(k)$$

$$y(k)=Cx(k)+Du(k)$$

where x represents the states of the system, u represents the manipulated variables which function as inputs to the system, and y represents the outputs of the system. Time may be expressed in discrete intervals (e.g., time-steps) by moving from a time-step k to the next time-step k+1.

In the exemplary embodiment, the state space system may be characterized by matrices A, B, C, and D. These four matrices may contain the system parameters (e.g., energy characteristics of the building system) which allow predictions to be made regarding future system states. In some embodiments, the system parameters may be specified in advance, imported from a previously identified system, received from a separate process, specified by a user, or otherwise received or retrieved. In other embodiments, system matrices A, B, C, and D may be identified using a system identification process, described in greater detail in reference to FIG. 8.

In further embodiments, the system parameters may be adaptively identified on a recursive basis to account for changes to the building system over time. A recursive system identification process is described in greater detail in reference to FIG. 9. For example, a state space representation for a system with changing model may be expressed as:

$$x(k+1)=A(\theta)x(k)+B(\theta)u(k)$$

$$y(k)=C(\theta)x(k)+D(\theta)u(k)$$

where θ represents variable parameters in the system. A change to the physical geometry of the system (e.g., knocking down a wall) may result in a change to the system parameters. However, a change in disturbances to the system such as heat transfer through the exterior walls (e.g., a change in weather), heat generated from people in the building, or heat dissipated from electrical resistance within the building (e.g., a load change) may not result in a change to the system parameters because no physical change to the building itself has occurred.

Still referring to FIG. 1, process 500 may include accounting for disturbances to the system (step 504). Disturbances to the system may include factors such as external weather conditions, heat generated by people in the building, or heat generated by electrical resistance within the building. In other words, disturbances to the system may include factors having an impact on system states (e.g., building temperature, building power use, etc.) other than controllable inputs to the system. While accounting for disturbances represents a departure from the deterministic state space model, a more robust solution in the presence of disturbances can be achieved by forming a stochastic state space representation.

In some embodiments, an observer-based design may be used to allow an estimation of the system states which may not be directly measurable. Additionally, such a design may account for measurement error in system states which have a noise distribution associated with their measurement (e.g., an exact value may not be accurately measurable). The stochastic state space representation for a system can be expressed as:

$$x(k+1)=A(\theta)x(k)+B(\theta)u(k)+w(k)$$

$$y(k)=C(\theta)x(k)+D(\theta)u(k)+v(k)$$

$$w(k)\sim N(0,Q)\ v(k)\sim N(0,R)$$

where w and v are disturbance and measurement noise variables. The solution to this state estimation problem may be given by the function:

$$\hat{x}(k+1|k)=A(\theta)\hat{x}(k|k-1)+B(\theta)u(k)+K(\theta)[y(k)-\hat{y}(k|k-1)]$$

$$\hat{y}(k|k-1)=C(\theta)\hat{x}(k|k-1)+D(\theta)u(k),\ \hat{x}(0;\theta)$$

where K is the Kalman gain and the hat notation $\hat{x}$, $\hat{y}$ implies an estimate of the state and output respectively. The notation (k+1|k) means the value at time step k+1 given the information at time step k. Therefore the first equation reads "the estimate of the states at time step k+1 given the information up to time step k" and the second equation reads "the estimate of the output at time step k given the information up to time step k−1." The estimate of the states and outputs are used throughout the cost minimization problem over the prediction and control horizons.

Still referring to FIG. 1, process 500 may further include developing a framework energy model of the building system using physical principles to describe the energy characteristics of the system in terms of undefined system parameters (step 506). The framework energy model may include generalized energy characteristics of the building system (e.g., thermal resistances, thermal capacitances, heat transfer rates, etc.) without determining numerical values for such quantities.

In some embodiments, model predictive control (MPC) may be used to develop the framework energy model. MPC is a unifying control methodology that incorporates technologies of feedback control, optimization over a time horizon with constraints, system identification for model parameters, state estimation theory for handling disturbances, and a robust mathematical framework to enable a state of the art controller. An exemplary MPC controller 1700 and diagrams which may be used to develop a framework energy model are described in greater detail in reference to FIG. 2-FIG. 7. In some embodiments a framework energy model for the building system may be developed (step 506) for two or more MPC controllers.

Still referring to FIG. 1, process 500 may further include obtaining system parameters for the framework energy model of the building system (step 508). In some embodiments, the system parameters may be specified in advance, imported from a previously identified system, received from a separate process, specified by a user, or otherwise received or retrieved. In other embodiments, system parameters are identified using a system identification process such as process 1100, described in greater detail in reference to FIG. 8.

Figure 2:
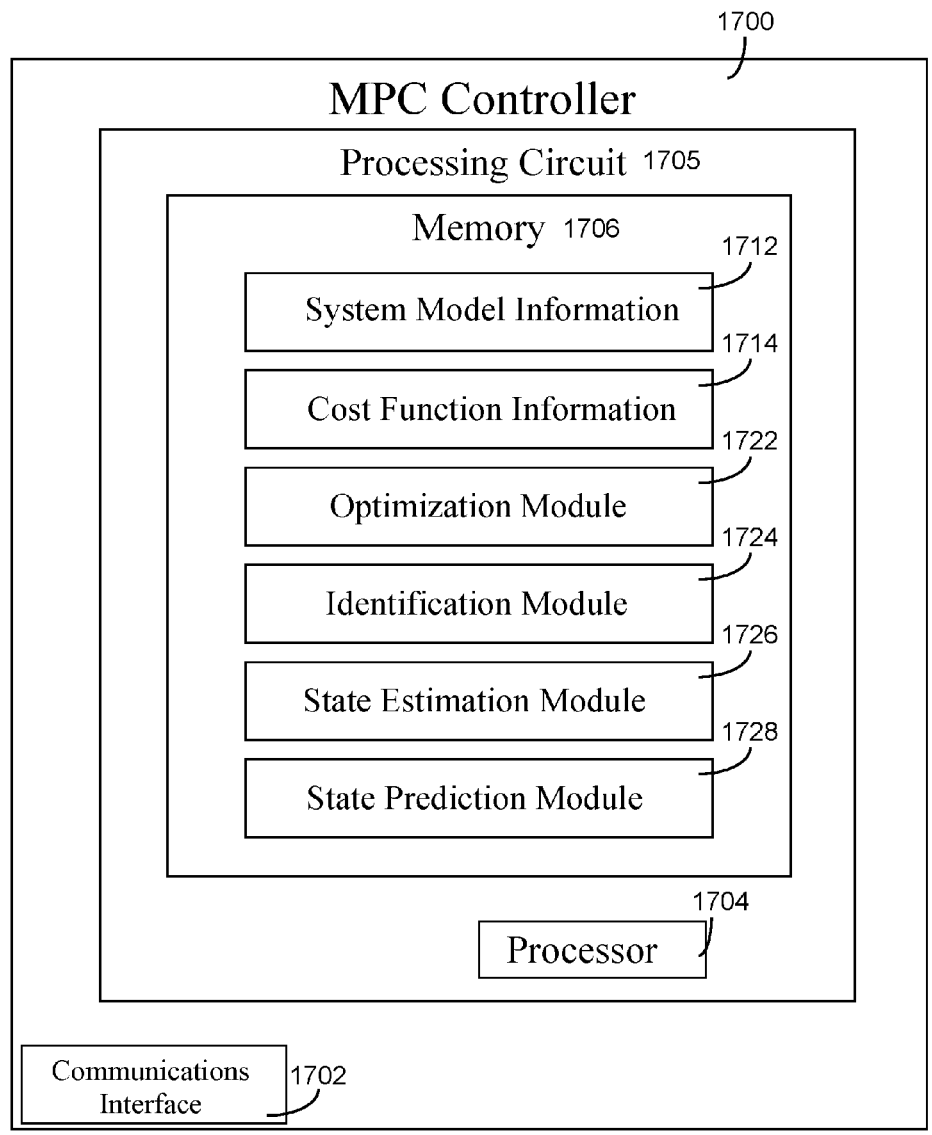
FIG. 2 is a block diagram of a model predictive controller including memory on which instructions for the various processes described herein are contained, a processor for carrying out the processes, and a communications interface for sending and receiving data, according to an exemplary embodiment.

Referring now to FIG. 2, a block diagram illustrating the components of a MPC controller 1700 is shown, according to an exemplary embodiment. MPC controller 1700 may include a communications interface 1702 for sending and receiving information such as system state information, pricing information, system model information, setpoint information, or any other type of information to or from any potential source or destination. Communications interface 1702 may include wired or wireless interfaces (e.g., jacks, antennas, transmitters, receivers, transceivers, wire terminals, etc.) for conducting data communications with the system or other data sources.

MPC controller 1700 may further include a processing circuit 1705 having a processor 1704 and memory 1706. Processor 1704 can be implemented as a general purpose processor, an application specific integrated circuit (ASIC), one or more field programmable gate arrays (FPGAs), a group of processing components, or other suitable electronic processing components. Memory 1706 may include one or more devices (e.g., RAM, ROM, Flash memory, hard disk storage, etc.) for storing data and/or computer code for completing and/or facilitating the various processes, layers, and modules described in the present disclosure. Memory 1706 may comprise volatile memory or non-volatile memory. Memory 1706 may include database components, object code components, script components, or any other type of information structure for supporting the various activities and information structures described in the present disclosure. According to an exemplary embodiment, the memory 1706 is communicably connected to the processor 1704 and includes computer instructions for executing (e.g., by the processor 1704) one or more processes described herein.

Memory 1706 may include an optimization module 1722 for completing an optimization procedure, an identification module 1724 for performing system identification, a state estimation module 1726 to estimate system states based on the data received via the communications interface 1702, and a state prediction module 1728 to predict future system states.

Memory 1706 may further include system model information 1712 and cost function information 1714. System model information 1712 may be received via the communications interface 1702 and stored in memory 1706 or may be developed by MPC controller 1700 using identification module 1724, processor 1704, and data received via communications interface 1702. System model information 1712 may relate to one or more energy models of a building system and may be used by processor 1704 in one or more processes using state estimation module 1726, state prediction module 1728, or optimization module 1722. Similarly, cost function information 1714 may be received via the communications interface 1702 and stored in memory 1706, or it may be developed by the MPC controller 1700 using data received via the communications interface 1702. Cost function information 1714 may be used by 1704 processor in one or more processes using the system identification module 1724 or optimization module 1722.

In some embodiments, MPC controller 1700 may compensate for an unmeasured disturbance to the system. MPC controller 1700 may be referred to as an offset-free or zero-offset MPC controller. In classical controls, the integral mode in PID controller serves to remove the steady state error of a variable. Similarly, the state space model can be augmented with an integrating disturbance d, as shown in the following equation, to guarantee zero offset in the steady state:

$$\begin{bmatrix} x(k+1) \\ d(k+1) \end{bmatrix} = \begin{bmatrix} A(\theta) & B_D \\ 0 & I \end{bmatrix} \begin{bmatrix} x(k) \\ d(k) \end{bmatrix} + \begin{bmatrix} B(\theta) \\ 0 \end{bmatrix} u(k) + w(k)$$

$$y(k) = \begin{bmatrix} C(\theta) & C_D \end{bmatrix} \begin{bmatrix} x(k) \\ d \end{bmatrix} x(k) + D(\theta) u(k) + v(k)$$

The number of integrating disturbances to introduce may equal the number of measurements needed to achieve zero offset, independent from tuning the controller.

Figure 3:
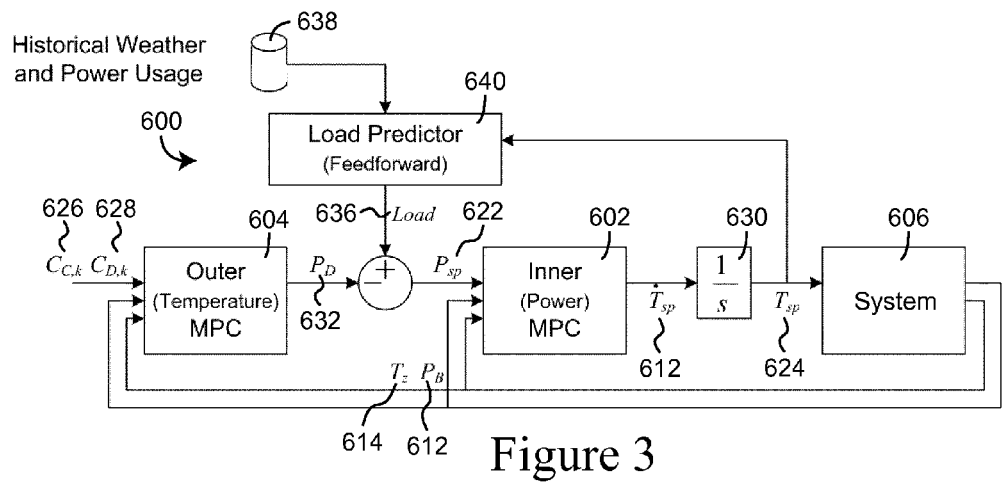
FIG. 3 is a block diagram of a cascaded model predictive control system featuring an inner MPC controller and an outer MPC controller, according to an exemplary embodiment.

Referring now to FIG. 3, a cascaded MPC system 600 is shown, according to an exemplary embodiment. System 600 may include an inner MPC controller 602 and an outer MPC controller 604. Inner MPC controller 606 may function within an inner control loop contained within an outer control loop. This inner-outer control loop architecture may be referred to as a "cascaded" control system.

Cascaded MPC system 600 disclosed herein has several advantages over a single MPC controller. For example, system 600 may allow inner MPC controller 602 to operate at a shorter sampling and control interval to quickly reject disturbances while outer MPC controller 604 may operate at a longer sampling and control interval to maintain optimal power usage. In some embodiments, the sampling and control execution time of inner MPC controller 602 may be around thirty seconds whereas the sampling and control execution time of outer MPC controller 604 may be around fifteen minutes. The choice of fifteen minutes may be driven by a frequency of changes in energy pricing data (e.g., in the real-time pricing rate structure, energy prices may change as frequently as once per fifteen minutes). However, in other embodiments longer or shorter control times may be used.

The cascaded design advantageously permits the development of a less complex energy model than could be achieved with a single comprehensive energy model for the entire building system. Another advantage of the cascaded design is that inner controller 602 and outer controller 604 may be decoupled in location. For example, the outer controller 604 may be implemented off-site or "in the cloud" whereas the inner controller 602 may be run in a supervisory environment. In some embodiments, outer controller 604 may receive input from multiple building systems and may interact with multiple inner controllers.

Still referring to FIG. 3, MPC controller 602 may be responsible for keeping the building's power use 612 ($P_B$) at a power setpoint 622 ($P_{sp}$) by modulating a temperature setpoint 624 ($T_{sp}$). To avoid saturation of the inner loop, inner MPC controller 602 may determine the necessary change in the temperature setpoint 626 ($\dot{T}_{sp}$), which may be integrated through integrator block 630 before being sent to the building system 606. Outer MPC controller 604 may use electric consumption and demand prices, 626 ($C_{C,k}$) and 628 ($C_{D,k}$) respectively, to determine an amount of power that should be deferred 632 ($P_D$). The deferred power 632 may be subtracted from a typical building load 636. Feed forward predictor 640 may determine the typical building load 636 using past weather and power use data 638.

Although specific input and output variables have been mentioned, it is appreciated that the disclosed model may be used to control a wide variety of systems having a wide variety of system states. The specific input and output variables for both inner MPC controller 602 and outer MPC controller 604 are provided for exemplary purposes only and are not intended to limit the scope of invention.

Figure 4:
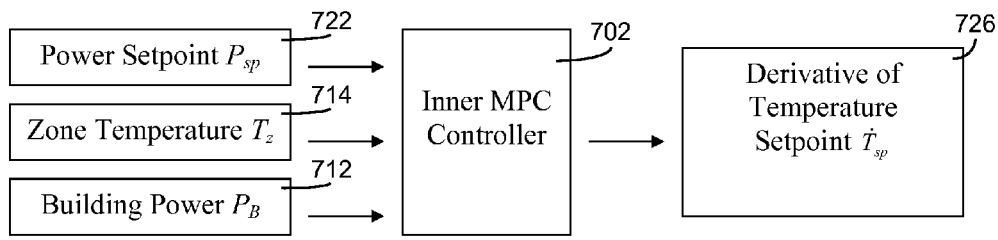
FIG. 4 is a detailed block diagram showing the inputs and outputs of the inner MPC controller, according to an exemplary embodiment.

Referring now to FIG. 4, a diagram illustrating the inputs and outputs for inner MPC controller 602 are shown, according to an exemplary embodiment. Inner MPC controller 702 may receive a power setpoint 722 ($P_{sp}$) as an input. In some embodiments, power setpoint 722 may be an optimal power usage as determined by outer MPC controller 604. In other embodiments, historical weather and power usage data 638 may be used to determine a typical building load 636 (e.g., a predicted or historical amount of energy needed to maintain the building temperature within temperature constraints). If a typical building load 636 is determined, outer MPC controller 604 may be used to determine an amount of power that should be deferred 632. In some embodiments, the amount of deferred power 632 is subtracted from the typical building load 636 before being sent to the inner MPC controller 702 as a power setpoint 722. The amount of deferred power 632 may be positive (e.g., subtracted from the typical building load 636) or negative (e.g., added to the typical building load 636).

Still referring to FIG. 4, inner MPC controller 702 may further receive a zone temperature 714 ($T_z$) as an input. Zone temperature 714 may be a variable representing a state of the system. In a single zone building, zone temperature 714 may be the measured temperature of the single building zone (e.g., a room, floor, area, combination of rooms or floors, etc). In a more complex building with several zones, zone temperature 714 may be a weighted average of the temperatures of multiple building zones. In some embodiments, the weighted average may be based on the area or volume of one or more zones. Additionally, the weighted average may be based on the relative position of the zone temperatures within the demand response temperature range. For example, zone temperature 714 may be calculated as follows:

$$T_z = \sum_i w_i \left( \frac{T_{z,i} - T_{min,i}}{T_{max,i} - T_{min,i}} \right)$$

where $w$ is the weight of a zone and $T_{max}$ and $T_{min}$ represent the minimum and maximum allowable temperatures for that zone. In this case, the variable representing the zone temperatures may be normalized (e.g., between 0 and 1).

In the exemplary embodiment, zone temperature 714 may be the temperature of the air inside the building. However, in other embodiments zone temperature 714 may represent the temperature of any part of the building or even a non-temperature system state. Zone temperature 714 may be measured directly, calculated from measured quantities, or otherwise generated by the system. In some embodiments, controller 702 may receive information representative of a measured temperature. Information representative of a measured temperature may be the measured temperature itself or information from which a building temperature may be calculated.

Still referring to FIG. 4, inner MPC controller 702 may further receive a current power usage 712 of the building. Current power usage 712 may be received as a feedback input for inner MPC controller 702. Inner MPC controller 702 may attempt to control current power usage 712 to match power setpoint 722. In the exemplary embodiment, current power usage 712 is an amount of power currently used by the building. However, in other embodiments, power usage 712 may represent any other state of the system, depending on the variable or variables sought to be controlled. Power usage 712 may be measured directly from the building system, calculated from measured quantities, or otherwise generated by any other method or process.

Still referring to FIG. 4, inner MPC controller 702 may output the derivative of a temperature setpoint $\dot{T}_{sp}$ 726. The derivative of the temperature setpoint 726 may be used by inner MPC controller 702 to control power usage 712. In a simple single-zone building, $\dot{T}_{sp}$ 726 may be a rate at which the temperature setpoint 624 is to be increased or decreased for the single zone. In multiple-zone buildings, $\dot{T}_{sp}$ 726 may be applied to the respective temperature setpoints for each individual zone. In other embodiments having multiple building zones, $\dot{T}_{sp}$ 726 may be broken into multiple outputs using a weighted average calculation based on the relative positions of the zone temperatures within the demand response range.

In the exemplary embodiment, the derivative of the temperature setpoint 726 may be chosen as the output of the inner MPC controller 702 because the system 606 is expected to perform as a "negative 1" type system. In other words, a step change in the temperature setpoint 624 may cause a very small change in steady-state power usage. Therefore to prevent steady-state offset (or an offset the decays very slowly) the controller 702 may have two integrators. The first integrator may be implicit in the disturbance model of the MPC controller (e.g., included as an integrating disturbance 506) whereas the second integrator 630 may be explicitly located downstream of inner MPC controller 602, as shown in FIG. 3.

Although the exemplary embodiment uses a derivative of temperature setpoint 726 as the output variable for the inner MPC controller 702, other embodiments may use different output variables or additional output variables depending on the specific application of the control system.

Figure 5:
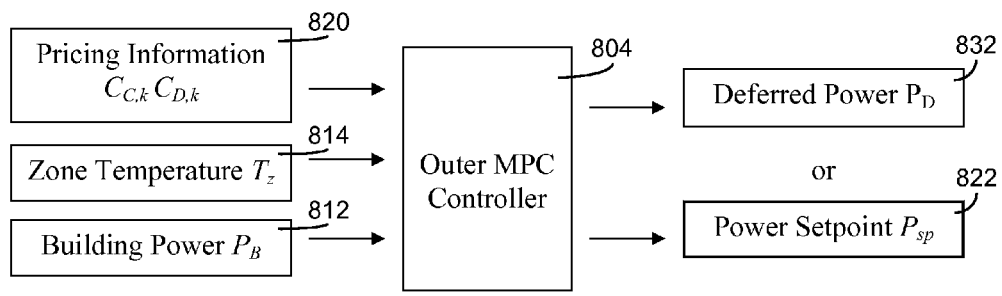
FIG. 5 is a detailed block diagram showing the inputs and outputs of the outer MPC controller, according to an exemplary embodiment.

Referring now to FIG. 5, a diagram illustrating inputs and outputs for outer MPC controller 604 is shown, according to an exemplary embodiment. Outer MPC controller 604 may be responsible for calculating an amount of power to defer 632, based on current and future energy prices 626 and 628, while maintaining building temperature 614 within acceptable bounds. As long the temperature constraints are satisfied, temperature 614 may be allowed to fluctuate. Thus, the goal of the outer MPC controller 604 is to minimize the cost of energy subject to temperature constraints.

Still referring to FIG. 5, outer MPC controller 804 may receive the current zone temperature $T_z$ 814 and the current power usage $P_B$ 812 of the building system. As described in reference to FIG. 4, these two variables represent states of building system 606. Both states may be measured directly, calculated from measured quantities, or otherwise generated by building system 606.

Still referring to FIG. 5, outer MPC controller 804 may further receive pricing information 826 including energy consumption and demand prices, $C_{C,k}$ and $C_{D,k}$ respectively, according to an exemplary embodiment. The electric consumption price $C_{C,k}$ may be the cost per unit of energy consumed (e.g., $/J or $/kWh). $C_{C,k}$ may be applied as a multiplier to the total amount of energy used in a billing cycle, a pricing period, or any other time period to determine an energy consumption cost. The demand price $C_{D,k}$ may be an additional charge corresponding to the peak power (e.g., maximum rate of energy use) at any given time during a billing period. In a variable pricing scenario that has an on-peak, partial-peak, and off-peak time period, a customer may be charged a separate demand charge for the maximum power used during each pricing period. Pricing information 826 may include consumption and demand prices for one or more pricing periods or pricing levels including off-peak, partial-peak, on-peak, critical-peak, real-time, or any other pricing period or pricing level. In some embodiments, pricing information 826 may include timing information defining the times during which the various consumption prices and demand prices will be in effect.

In some embodiments, outer MPC controller 804 may further receive historical weather and power usage data. Historical weather and power usage data may be used to perform a feed-forward estimation of the building's probable power requirements. However, in other embodiments, this estimation may performed by a separate feed-forward module 640, as shown in FIG. 3. In further embodiments, historical weather and power usage data are not considered by the outer MPC controller 804 in determining the optimal power setpoint 822.

Figure 6:
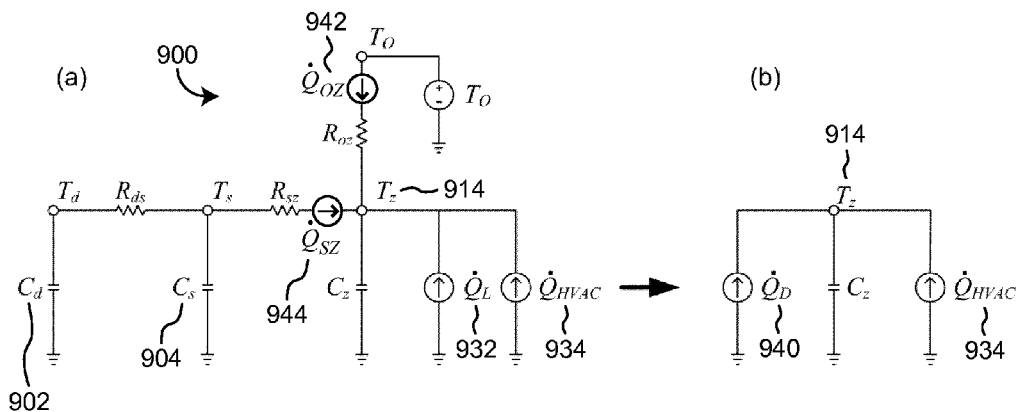
FIG. 6 is an energy balance diagram for formulating an energy model of the building system used by the inner MPC controller, according to an exemplary embodiment.

Referring now to FIG. 6, a energy transfer diagram 900 for building system is shown, according to an exemplary embodiment. Diagram 900 may be used to develop a framework energy model of the building system for the inner MPC controller. In the exemplary embodiment, the building system is modeled in diagram 900 as a single-zone building with a shallow mass and a deep mass. The shallow mass may represent objects and/or materials in the building which have contact with the air inside the building (e.g., immediate wall material, drywall, furniture, floor, ceiling, etc.) whereas the deep mass may represent material which is separated from the air inside the building by the shallow mass (e.g., cement block, foundation, etc.).

Referring specifically to FIG. 6(*a*), T, C, and R, are used to represent temperatures, capacitances, and resistances, respectively, with the associated subscripts d, s, z, and O representing deep mass, shallow mass, zone air, and outside air, respectively. Also shown is the heat supplied 932 by people and electric resistance within the building ($\dot{Q}_L$), and the heat supplied 934 (or removed in the case of a negative number) by the HVAC system ($\dot{Q}_{HVAC}$).

Referring now to FIG. 6(*b*), the framework energy model can be simplified by eliminating $C_d$, $C_s$, and $\dot{Q}_L$, thereby significantly reducing the number of parameters in the model. A reduced number of parameters may increase the robustness of system identification and reduce the computational effort of the inner MPC controller. Because the major dynamics of the system may be fast compared to the time constants of the deep mass capacitance 902 ($C_d$), the shallow mass capacitance 904 ($C_s$), and the rate of change of the human and electric load 932 ($\dot{Q}_L$), these time varying sources of heat entering the zone temperature node 914 may be treated as a slowly moving disturbance. The slowly moving disturbance 940 may be represented as $\dot{Q}_D$ which includes conduction and convection of outside air 942, heat transfer from the shallow mass 944, and heat generated from people and electrical use inside the building 932.

In the exemplary embodiment, $\dot{Q}_{HVAC}$ 934 may be modeled as the output of a PI controller. Thus, the rate of change in zone temperature may be given by the equation:

$$C_z \dot{T}_z = K_q[K_P(T_{sp}-T_z)+K_1 I]+\dot{Q}_D$$

and the integral may be given by:

$$\dot{I}=T_{sp}-T_z$$

Additionally, because $\dot{Q}_{HVAC}$ 934 represents the power delivered to the system, additional equations may be introduced to compensate for the power lost in transportation. For example, in the case of a water cooled building, the energy balance may be maintained by heating water in the building which may be transported to a chiller/tower system where the heat may be expelled into to the atmosphere. In the exemplary embodiment, the transport process that converts the cooling power delivered to the building system to a power use at a cooling tower may be modeled by an over-damped second-order system with one (shorter) time constant $\tau_1$ representing the delay and a second time constant $\tau_2$ representing mass of cooling fluid.

$$\ddot{P}+(\tau_1+\tau_2)\dot{P}+(\tau_1\tau_2)P=P_{ss}$$

$$P_{ss}=K_e[K_P(T_{sp}-T_z)+K_1 I]$$

The additional values that have been introduced are defined as follows: P is the power used by the cooling equipment (e.g., at the cooling/chilling towers), $P_B$ is the power usage as measured by the building, $K_q$ is coefficient that converts PID output to heating power, $K_e$ is coefficient that converts PID output to a steady-state power usage by the central plant equipment, and $\tau_1$ and $\tau_2$ are the time constants of the power transport process.

Therefore, in an exemplary embodiment, the entire model needed by the inner MPC controller 602 can be represented by:

$$\begin{bmatrix} \dot{T}_z \\ \dot{I} \\ \dot{P} \\ \ddot{P} \\ \dot{T}_{sp} \\ \dot{P}_{Dist} \end{bmatrix} = \begin{bmatrix} \frac{-K_q K_P}{C_z} & \frac{K_q K_I}{C_z} & 0 & 0 & \frac{K_q K_P}{C_z} & 0 \\ -1 & 0 & 0 & 0 & 1 & 0 \\ 0 & 0 & 0 & 1 & 0 & 0 \\ -K_e K_P & K_e K_I & -\tau_1\tau_2 & -\tau_1-\tau_2 & K_e L_P & 0 \\ 0 & 0 & 0 & 0 & 0 & 0 \\ 0 & 0 & 0 & 0 & 0 & 0 \end{bmatrix} \begin{bmatrix} T_z \\ I \\ P \\ \dot{P} \\ T_{sp} \\ P_{Dist} \end{bmatrix} + \begin{bmatrix} 0 & 0 \\ 0 & 0 \\ 0 & 0 \\ 0 & 0 \\ 1 & 0 \\ 0 & 1 \end{bmatrix} \begin{bmatrix} \dot{T}_{sp} \\ \dot{P}_{Dist} \end{bmatrix}$$

$$\begin{bmatrix} T_z \\ P_B \end{bmatrix} = \begin{bmatrix} 1 & 0 & 0 & 0 & 0 & 0 \\ 0 & 0 & 1 & 0 & 0 & 1 \end{bmatrix} \begin{bmatrix} T_z \\ I \\ P \\ \dot{P} \\ T_{sp} \\ P_{Dist} \end{bmatrix}$$

where $\dot{Q}_D$ 940 as well as any power usage by loads other than HVAC equipment may be incorporated into the power disturbance $P_{Dist}$, which may be added to the measured power output $P_B$ 612. Advantageously, modeling $P_{Dist}$ in such a way may allow for offset free control in the presence of slowly changing disturbances.

In the exemplary embodiment, after converting to discrete time and substituting θ variables for the unknown system parameters, the complete inner loop framework energy model may be given by:

$$\begin{bmatrix} T_z(k+1) \\ I(k+1) \\ P(k+1) \\ \dot{P}(k+1) \\ P_{Dist}(k+1) \end{bmatrix} =$$

$$\begin{bmatrix} 1-\theta_1 & \theta_1\theta_2 & 0 & 0 & 0 \\ -1 & 1 & 0 & 0 & 0 \\ 0 & 0 & 1 & 1 & 0 \\ -\theta_3 & \theta_2\theta_3 & -\theta_4\theta_5 & 1-\theta_4-\theta_5 & 0 \\ 0 & 0 & 0 & 0 & 1 \end{bmatrix} \begin{bmatrix} T_z(k) \\ I(k) \\ P(k) \\ \dot{P}(k) \\ P_{Dist}(k) \end{bmatrix} + \begin{bmatrix} \theta_1 \\ 1 \\ 0 \\ \theta_3 \\ 0 \end{bmatrix} T_{sp}(k)$$

-continued $$\begin{bmatrix} T_z(k) \\ P_B(k) \end{bmatrix} = \begin{bmatrix} 1 & 0 & 0 & 0 & 0 \\ 0 & 0 & 1 & 0 & 1 \end{bmatrix} \begin{bmatrix} T_z(k) \\ I(k) \\ P(k) \\ \dot{P}(k) \\ P_{Dist}(k) \end{bmatrix}$$

Although the discrete time model shows $P_{Dist}$ as a constant, a Kalman gain (used in the state estimation process) may be used to optimally convert measurement errors to state estimation error, thereby causing $P_{Dist}$ to change.

Figure 7:
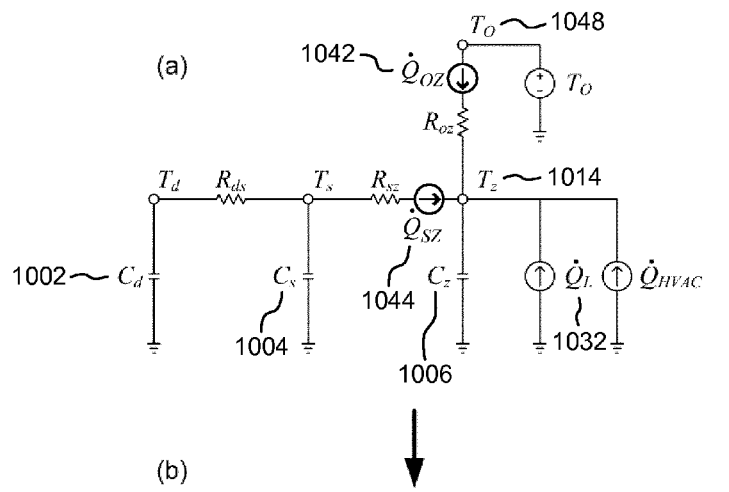
FIG. 7 is an energy balance diagram for formulating an energy model of the building system used by the outer MPC controller, according to an exemplary embodiment.
Figure 7:
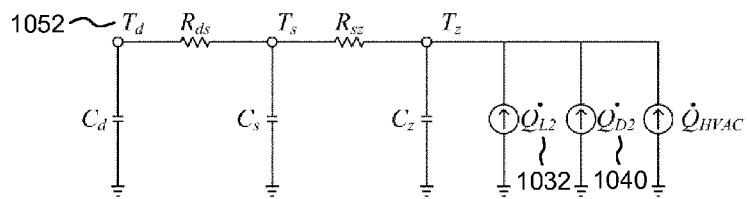

Referring now to FIG. 7, an energy transfer diagram 1000 for building system is shown, according to an exemplary embodiment. Diagram 1000 may be used to develop a framework energy model of the building system for the outer MPC controller. Referring specifically FIG. 7(a), a complete energy diagram for the outer loop framework energy model is shown, according to an exemplary embodiment. For the outer control loop, all forms of capacitance 1002, 1004, and 1006 in the building may be included in the model because it may no longer be sufficient to treat the heat transfer from the shallow mass 1044 as a slowly moving disturbance. For example knowledge of the states of these capacitors and how heat is transferred between them may be relevant to a prediction of how zone temperature 1014 will change. In other words, an objective of the outer loop model may be to predict the state of these capacitors.

Referring now to FIG. 7(b), a simplified energy diagram for the outer loop framework energy model is shown. Two simplifying assumptions may be made in converting the complete energy diagram (FIG. 7(a)) to the simplified energy diagram (FIG. 7(b)). First, it may be assumed that the energy transferred through external conduction and convection 1042 and the typical load profile at a constant setpoint $\dot{Q}_{L2}$ 1032 can be estimated based on time of day and temperature difference between the outside air temperature 1048 and the zone 1014 (e.g., $T_o - T_z$). Estimation may performed by the feed forward load predictor 640 shown in FIG. 3. The random portion of the load profile (e.g., the portion that is independent of time of day and temperature difference) may be represented an integrated disturbance $\dot{Q}_{D2}$ 1040.

Second, in an exemplary embodiment, energy transfer equations describing the model shown in FIG. 7(b) may be expressed as:

$$C_z \dot{T}_z = \frac{T_s - T_z}{R_{sz}} + \dot{Q}_{L2} + \dot{Q}_{D2} + \dot{Q}_{HVAC}$$

$$C_s \dot{T}_s = \frac{T_d - T_s}{R_{ds}} + \frac{T_z - T_s}{R_{sz}}$$

$$C_s \dot{T}_s = \frac{T_d - T_s}{R_{ds}} + \frac{T_z - T_s}{R_{sz}}$$

To convert these equations to the framework energy model used by outer MPC controller 604, the heat transfers may be converted to powers that can be measured at the meter by assuming a constant of proportionality between the two. For example, $\dot{Q}_{HVAC}$ may be converted to $P_{HVAC}$ by multiplying by a coefficient of performance.

In the exemplary embodiment, inputs to the outer MPC controller 604 may be divided into controllable inputs, measured disturbances (e.g., uncontrollable but measurable inputs), and unmeasured disturbances (e.g., uncontrollable and unmeasured inputs). To make this division, the inputs may be reformulated to $P_C$ (e.g., the power required to keep the zone temperature constant) and $P_D$ (e.g., the deferred power). $P_D$ may be a controllable input because it may be possible to control the amount of power to defer. $P_C$ may be a measured disturbance because it may be possible to estimate the power required maintain a constant building temperature based the difference between outdoor air temperature and the temperature within the building. In some embodiments, estimation of $P_C$ ($P_{L2}$ and the portion of $P_{HVAC}$ that comes from a constant setpoint) may be performed in a feed forward fashion as shown in FIG. 3. Finally, $P_{D2}$ may be an unmeasured disturbance and can be viewed as the estimation error in $P_C$. Thus, the framework energy model of the building system used by the outer MPC controller may be expressed as:

$$\begin{bmatrix} \dot{T}_d \\ \dot{T}_s \\ \dot{T}_z \\ \dot{P}_{D2} \end{bmatrix} = \begin{bmatrix} \frac{-1}{R_{ds}C_d} & \frac{1}{R_{ds}C_d} & 0 & 0 \\ \frac{1}{R_{ds}C_s} & -\left(\frac{1}{R_{ds}C_s} + \frac{1}{R_{sz}C_s}\right) & \frac{1}{R_{sz}C_s} & 0 \\ 0 & \frac{1}{R_{sz}C_z} & \frac{-1}{R_{sz}C_z} & K_1 \\ 0 & 0 & 0 & 0 \end{bmatrix}$$

$$\begin{bmatrix} T_d \\ T_s \\ T_z \\ P_{D2} \end{bmatrix} + \begin{bmatrix} 0 & 0 & 0 \\ 0 & 0 & 0 \\ K'_2 & 0 & 0 \\ 0 & 0 & 1 \end{bmatrix} \begin{bmatrix} P_D \\ P_C(T_{OA} - T_z, t) \\ \dot{P}_{D2} \end{bmatrix}$$

$$\begin{bmatrix} T_z \\ P_B \end{bmatrix} = \begin{bmatrix} 0 & 0 & 1 & 0 \\ 0 & 0 & 0 & 1 \end{bmatrix} \begin{bmatrix} T_d \\ T_s \\ T_z \\ P_{D2} \end{bmatrix} + \begin{bmatrix} 0 & 0 & 0 \\ -1 & 1 & 0 \end{bmatrix} \begin{bmatrix} P_D \\ P_C(T_{OA} - T_z, t) \\ \dot{P}_{D2} \end{bmatrix}$$

Advantageously, in the exemplary embodiment, $P_C$ may be a function of a state of the building system (e.g., $P_C = f(T_{OA} - T_z, t)$). This is a condition that many MPC implementations would not support. The alternative would be to perform feed forward estimation outside the MPC controller. However, this is suboptimal because the feed forward estimator would be unable predict how altering the setpoint 622 would affect $P_c$ because it would have no information regarding the current or predicted zone temperature $T_z$ 1014. For example, presently deferring power will result in the zone temperature 1014 becoming closer to the outside temperature 1048, thereby decreasing the rate of heat transfer 1042 through the walls of the building. By incorporating the load predictor into the MPC controller, this change can be predicted and $P_c$ can be adjusted accordingly.

In the exemplary embodiment, the outer loop model can be simplified further by assuming that changes in the deep mass temperature 1052 ($T_d$) occur at a rate that is much slower than the length of time power use can be deferred. With this assumption, the temperature of the deep mass 1052 may be considered a known input and the framework energy model used by outer MPC controller 604 may be expressed as:

$$\begin{bmatrix} T_s(k+1) \\ T_z(k+1) \\ P_{D2}(k+1) \end{bmatrix} = \begin{bmatrix} 1-(\theta_1+\theta_2) & \theta_2 & 0 \\ \theta_3 & -\theta_3 & \theta_4 \\ 0 & 0 & 1 \end{bmatrix} \begin{bmatrix} T_s(k) \\ T_z(k) \\ P_{D2}(k) \end{bmatrix} + \begin{bmatrix} \theta_1 & 0 & 0 \\ 0 & \theta_4 & 0 \\ 0 & 0 & 0 \end{bmatrix} \begin{bmatrix} T_d(k) \\ P_D(k) \\ P_C(T_{OA}-T_z,k) \end{bmatrix}$$

$$\begin{bmatrix} T_z(k) \\ P_B(k) \end{bmatrix} = \begin{bmatrix} 0 & 1 & 0 \\ 0 & 0 & 1 \end{bmatrix} \begin{bmatrix} T_s(k) \\ T_z(k) \\ P_{D2}(k) \end{bmatrix} + \begin{bmatrix} 0 & 0 & 0 \\ 0 & -1 & 1 \end{bmatrix} \begin{bmatrix} T_d(k) \\ P_D(k) \\ P_C(T_{OA}-T_z,k) \end{bmatrix}$$

Figure 8:
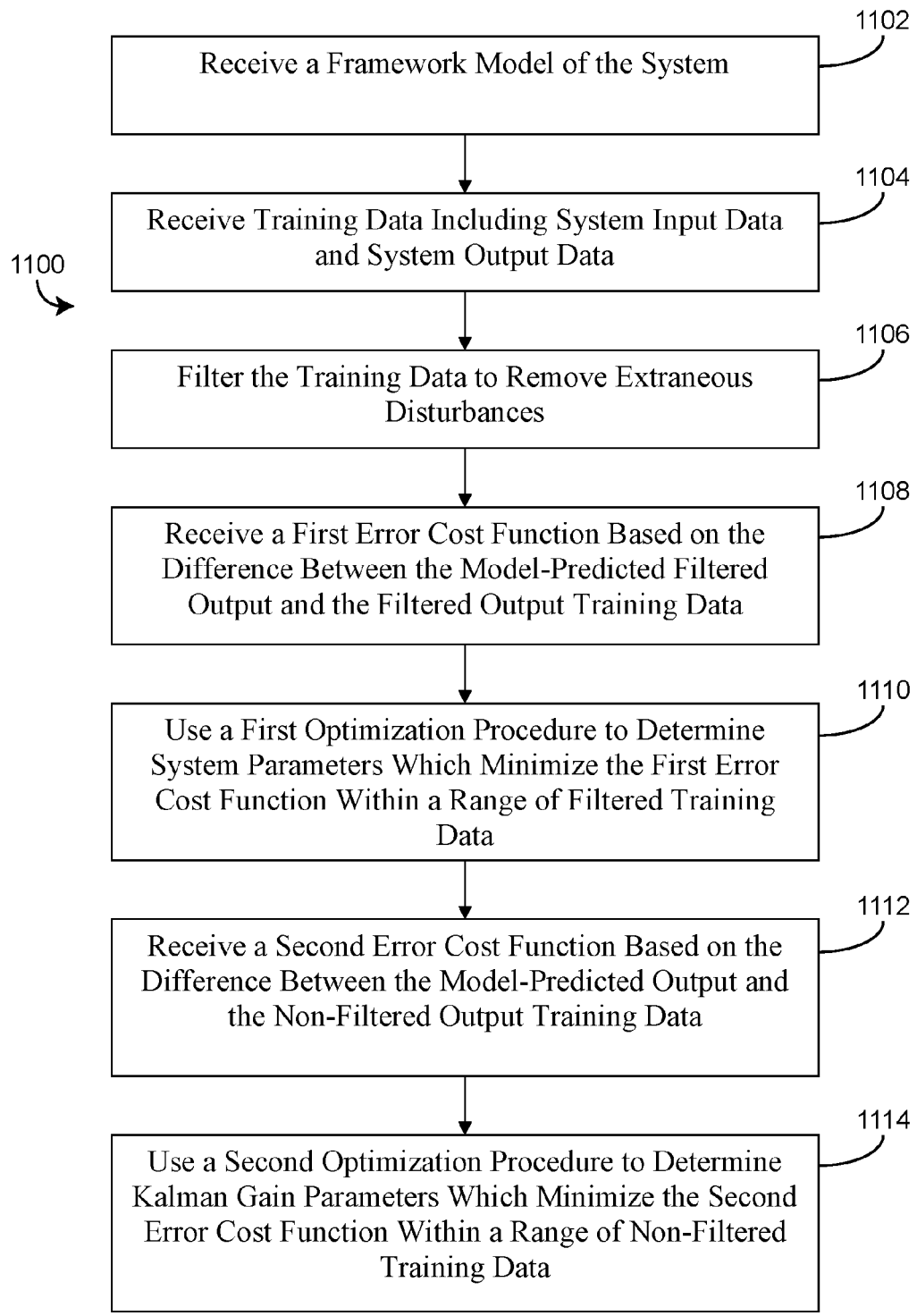
FIG. 8 is a flowchart of a process for identifying model parameters in an offline or batch process system identification process using a set of training data, according to an exemplary embodiment.

Referring now to FIG. 8, a flowchart of a process 1100 to identify unspecified system parameters in a framework model is shown, according to an exemplary embodiment. Process 1100 may use an offline (batch) process to identify system parameters using a set of training data (e.g., sample input and output data used to gauge the response of the building system). However, in other embodiments, other system identification processes may be used. Process 1100 may be used to identify model parameters θ which minimize the cost of prediction error (e.g., the cost of differences between model-predicted outputs and the true system outputs).

In the exemplary embodiment, process 1100 may include receiving a framework energy model for the building system (step 1102), receiving training data including system input data and system output data (step 1104), filtering the training data to remove extraneous disturbances (step 1106), receiving a first error cost function based on the difference between the filtered output training data and a model-predicted filtered output (step 1108), and using a first optimization procedure to determine system parameters which minimize the first error cost function within a range of filtered training data (step 1110).

In some embodiments, process 1100 may further include receiving a second error cost function based on the difference between non-filtered output training data and a model-predicted non-filtered output (step 1112), and using a second optimization procedure to determine Kalman gain parameters which minimize the second error cost function within a range of non-filtered training data (step 1114).

Still referring to FIG. 8, process 1100 may include receiving a framework energy model for the building system (step 1102). The framework energy model may be a framework energy model for the entire system or may be a framework energy model for either the inner MPC controller or outer MPC controller. In the exemplary embodiment, step 506 of process 500 may be used to develop a framework model using a discrete time state space representation of the building system with variable system parameters θ. For example, the framework energy model of the building system used by the inner MPC controller can be expressed as:

$$\begin{bmatrix} T_z(k+1) \\ I(k+1) \\ P(k+1) \\ \dot{P}(k+1) \end{bmatrix} = \begin{bmatrix} 1-\theta_1 & \theta_1\theta_2 & 0 & 0 \\ -1 & 1 & 0 & 0 \\ 0 & 0 & 1 & 1 \\ -\theta_3 & \theta_2\theta_3 & -\theta_4\theta_5 & 1-\theta_4-\theta_5 \end{bmatrix} \begin{bmatrix} T_z(k) \\ I(k) \\ P(k) \\ \dot{P}(k) \end{bmatrix} + \begin{bmatrix} \theta_1 \\ 1 \\ 0 \\ \theta_3 \end{bmatrix} T_{sp}(k)$$

$$\begin{bmatrix} T_z(k) \\ P(k) \end{bmatrix} = \begin{bmatrix} 1 & 0 & 0 & 0 \\ 0 & 0 & 1 & 0 \end{bmatrix} \begin{bmatrix} T_z(k) \\ I(k) \\ P(k) \\ \dot{P}(k) \end{bmatrix}$$

and the framework energy model used by the outer MPC controller can be expressed as:

$$\begin{bmatrix} T_s(k+1) \\ T_z(k+1) \end{bmatrix} = \begin{bmatrix} 1- (\theta_1+\theta_2) & \theta_2 \\ \theta_3 & 1-\theta_3 \end{bmatrix} \begin{bmatrix} T_s(k) \\ T_z(k) \end{bmatrix} + \begin{bmatrix} 0 & 0 \\ \theta_4 & 0 \end{bmatrix} \begin{bmatrix} P_D(k) \\ P_C(T_{OA}-T_z,t) \end{bmatrix}$$

$$\begin{bmatrix} T_z \\ P_B \end{bmatrix} = \begin{bmatrix} 0 & 1 \\ 0 & 0 \end{bmatrix} \begin{bmatrix} T_s(k) \\ T_z(k) \end{bmatrix} + \begin{bmatrix} 0 & 0 \\ -1 & 1 \end{bmatrix} \begin{bmatrix} P_D(k) \\ P_C(T_{OA}-T_z,t) \end{bmatrix}$$

In both models, terms representing the slowly moving disturbances may be removed as these disturbances may be subsequently accounted for using a Kalman gain, described in greater detail in reference to steps 1112 and 1114.

Still referring to FIG. 8, process 1100 may further include receiving training data including system input data and system output data (step 1104). Training data may be received by varying the manipulated inputs to the system and monitoring the resultant system outputs. For example, for the inner MPC controller system model, the temperature setpoint may be varied whereas for the outer MPC controller system model, the power setpoint be varied. For both models, the actual building temperature and building power use may be monitored and recorded as output training data. In other embodiments, other manipulated variables may be varied depending on the framework model used for this step of the system identification process.

Still referring to FIG. 8, process 1100 may include filtering the training data to remove extraneous disturbances (step 1106). Step 1106 may be performed to distinguish (a) a change in system outputs caused by varying the manipulated inputs from (b) a change in system outputs caused by external disturbances to the system. For example, in the exemplary embodiment, the effect of heat transfer through the walls of the building $P_C(T_{OA}-T_z)$ may be treated as a slowly moving disturbance with dynamics much slower than that of the inner MPC controller system. By filtering the training data, the effect of this disturbance may be eliminated, thereby allowing the actual system parameters θ to be identified with greater accuracy.

In the exemplary embodiment, the filter applied to the training data may be a fourth-order high-pass Bessel filter with a cutoff frequency of $\omega_c$ of $1.75*10^{-3}$ rad/s. However, in other embodiments, other types of filters may be used, including band-pass filters, low-pass filters, or other types of high-pass filters with different cutoff frequencies. The type of filter may be driven by the frequency characteristics of the effects sought to be eliminated from the training data. For example, the cutoff frequency may chosen to eliminate the effects of slowly moving disturbances such as weather conditions or internal heat generation within the building while still capturing the dynamics of the system as they exist without external disturbances.

Still referring to FIG. 8, process 1100 may further include receiving a first error cost function (step 1108). Because filtered training data may be used for steps 1106-1110, the first error cost function may be based on the difference between the filtered output training data and the model-predicted filtered output (e.g., the error e). In some embodiments, the first error cost function may be pre-defined, received from memory, specified by a user, or otherwise received from any other source or process. In other embodiments, receiving the first error cost function may include defining or deriving the first error cost function.

Exemplary first error cost functions may include:

$$l[y(k)-\hat{y}(k|k-1)]=l[e(k)]=e^2(k)$$

which may be optimal for normally distributed errors, but sensitive to outliers:

$$l[e(k)] = \begin{cases} c^2\sigma^2 + c\sigma - e(k) & e(k) < -c\sigma \\ e^2(k) & -c\sigma < e(k) < c\sigma \\ c^2\sigma^2 - c\sigma + e(k) & e(k) > c\sigma \end{cases}$$

which linearizes error cost l for errors e outside specified bounds, and:

$$l[e(k)] = \begin{cases} c^2\sigma^2 & e(k) < -c\sigma \\ e^2(k) & -c\sigma < e(k) < c\sigma \\ c^2\sigma^2 & e(k) > c\sigma \end{cases}$$

for which the error cost l does not increase once the error e exceeds a threshold.

Still referring to FIG. 8, process 1100 may further include using a first optimization procedure to determine system parameters which minimize the first error cost function over a range of filtered training data (step 1110). Numerous optimization procedures may be used to minimize the first error cost function, including Gauss-Newton, Ninness-Wills, adaptive Gauss-Newton, Gradient Descent, and Levenberg-Marquardt search algorithms. The optimization procedure may use any of these search algorithms, a subset thereof, or any other minimization technique, algorithm, method, or procedure. For optimization purposes, initial system states may be estimated, received from a separate process, specified by a user, or fixed at any value.

The first error cost function may be used to determine the cost of prediction error within a range of filtered training data. The range of filtered training data may comprise the entire set of training data or a subset thereof. The training data used by the first error cost function may be automatically specified, chosen by a user, or otherwise determined by any other method or process.

Still referring to FIG. 8, process 1100 may further include receiving a second error cost function (step 1112). In some embodiments, the second error cost function may be pre-defined and may simply be received from memory, specified by a user, or otherwise received from any other source or process. In other embodiments, receiving the second error cost includes defining the second error cost function.

The second error cost function may use the same error cost algorithm as the first error cost function or it may use a different algorithm. However, unlike the first error cost function, the second error cost function may be based on the difference between the model-predicted output and the actual system output using the non-filtered training data.

Still referring to FIG. 8, process 1100 may further include using a second optimization procedure to determine Kalman gain parameters which minimize the second error cost function over a range of non-filtered training data (step 1114). In some embodiments, the Kalman gain can be parameterized and estimated along with the parameters of the system matrix as part of the first optimization procedure. In other embodiments, the system parameters may be estimated first using filtered training data while the Kalman gain parameters are fixed at zero. Then, the system parameters may be fixed and a second optimization procedure may be used to determine optimal Kalman gain parameters which minimize the cost of prediction error using the non-filtered training data.

Advantageously, determining the system parameters first allows for a more accurate prediction and reduces the possibility that the optimization procedure will settle on one of the local minima produced by estimating both the system parameters and the Kalman gain parameters simultaneously. Additionally, a separately determined Kalman gain may allow the MPC controller to predict future outputs, estimate system states, and optimally attribute measurement errors to either errors in the state estimate or to measurement noise.

Another advantage of process 1100 is the ability to estimate the current value of the load $P_C$. Thus, in the exemplary embodiment, the framework energy model shown in the following equations is used to estimate the steady-state Kalman gain for the building system model used by the inner MPC controller:

$$\begin{bmatrix} T_z(k+1) \\ I(k+1) \\ P_\Delta(k+1) \\ \dot{P}_\Delta(k+1) \\ P_C(k+1) \end{bmatrix} = \begin{bmatrix} 1-\theta_1 & \theta_1\theta_2 & 0 & 0 & 0 \\ -1 & 1 & 0 & 0 & 0 \\ 0 & 0 & 1 & 1 & 0 \\ -\theta_3 & \theta_2\theta_3 & -\theta_4\theta_5 & 1-\theta_4-\theta_5 & 0 \\ 0 & 0 & 0 & 0 & 1 \end{bmatrix} \begin{bmatrix} T_z(k) \\ I(k) \\ P_\Delta(k) \\ \dot{P}_\Delta(k) \\ P_C(k) \end{bmatrix} + \begin{bmatrix} \theta_1 \\ 1 \\ 0 \\ \theta_3 \\ 0 \end{bmatrix} T_{sp}(k) + v(k)$$

$$\begin{bmatrix} T_z(k) \\ P_B(k) \end{bmatrix} = \begin{bmatrix} 1 & 0 & 0 & 0 & 0 \\ 0 & 0 & 1 & 0 & 1 \end{bmatrix} \begin{bmatrix} T_z(k) \\ I(k) \\ P_\Delta(k) \\ \dot{P}_\Delta(k) \\ P_C(k) \end{bmatrix} + w(k)$$

with a parameterized Kalman gain of:

$$K(\theta) = \begin{bmatrix} \theta_6 & \theta_7 \\ \theta_8 & \theta_9 \\ \theta_{10} & \theta_{11} \\ \theta_{12} & \theta_{13} \\ \theta_{14} & \theta_{15} \end{bmatrix}$$

In the exemplary embodiment, the Kalman gain may be estimated for the outer MPC controller model using the following equations:

$$\begin{bmatrix} T_s(k+1) \\ T_z(k+1) \\ P_{D2}(k+1) \end{bmatrix} = \begin{bmatrix} 1-(\theta_1+\theta_2) & \theta_2 & 0 \\ \theta_3 & 1-\theta_3 & \theta_4 \\ 0 & 0 & \varphi_1 \end{bmatrix}$$

$$\begin{bmatrix} T_s(k) \\ T_z(k) \\ P_{D2}(k) \end{bmatrix} + \begin{bmatrix} \theta_1 & 0 & 0 & 0 \\ 0 & \theta_4 & 0 & 0 \\ 0 & 0 & 0 & 1 \end{bmatrix} \begin{bmatrix} T_d(k) \\ P_D(k) \\ P_C(T_{OA}-T_z,k) \\ \tilde{P}_{D2}(k) \end{bmatrix}$$

$$\begin{bmatrix} T_z(k) \\ P_B(k) \end{bmatrix} = \begin{bmatrix} 0 & 1 & 0 \\ 0 & 0 & 1 \end{bmatrix} \begin{bmatrix} T_s(k) \\ T_z(k) \\ P_{D2}(k) \end{bmatrix} + \begin{bmatrix} 0 & 0 & 0 & 0 \\ 0 & -1 & 1 & 0 \end{bmatrix} \begin{bmatrix} T_d(k) \\ P_D(k) \\ P_C(T_{OA}-T_z,k) \\ \tilde{P}_{D2}(k) \end{bmatrix}$$

with a parameterized Kalman gain of:

$$K(\theta) = \begin{bmatrix} \theta_6 & \theta_7 \\ \theta_8 & \theta_9 \\ \theta_{10} & \theta_{11} \end{bmatrix}$$

The parameters in the A and B matrices may be held constant at the values identified by the first optimization procedure while K is determined by the second optimization procedure using the non-filtered training data.

In the exemplary embodiment, initial values for the system states may estimated by assuming that assumed that the system states are initially at a steady-state (e.g., $x_{-1}$ is the same as $x_0$). With this assumption the following algebraic equation may be solved to find the initial conditions for the states:

$$x_k = Ax_k + Bu_k \Rightarrow x_0 = (I-A)^{-1}Bu_0.$$

To solve this problem, it can be assumed that because the system states are at a steady-state and the temperature setpoint is constant, the zone temperature $T_z$ is equal to the temperature setpoint. Additionally, the measured power may be assumed to be unchanging (e.g., $\dot{P}_A=0$) and can be attributed to the heat disturbances. Finally, at the steady-state, powers $P_A$ and $P_C$ may be interchangeable; therefore, $P_A$ may be set to zero and $P_C$ may be set to the current power usage. In this way, the state of the integrator can also be initialized to zero. With these assumptions in place, the process 1100 may identify the Kalman gain parameters using a second optimization procedure (step 1114) while fixing the system parameters at the values determined by the first optimization procedure.

Figure 9:
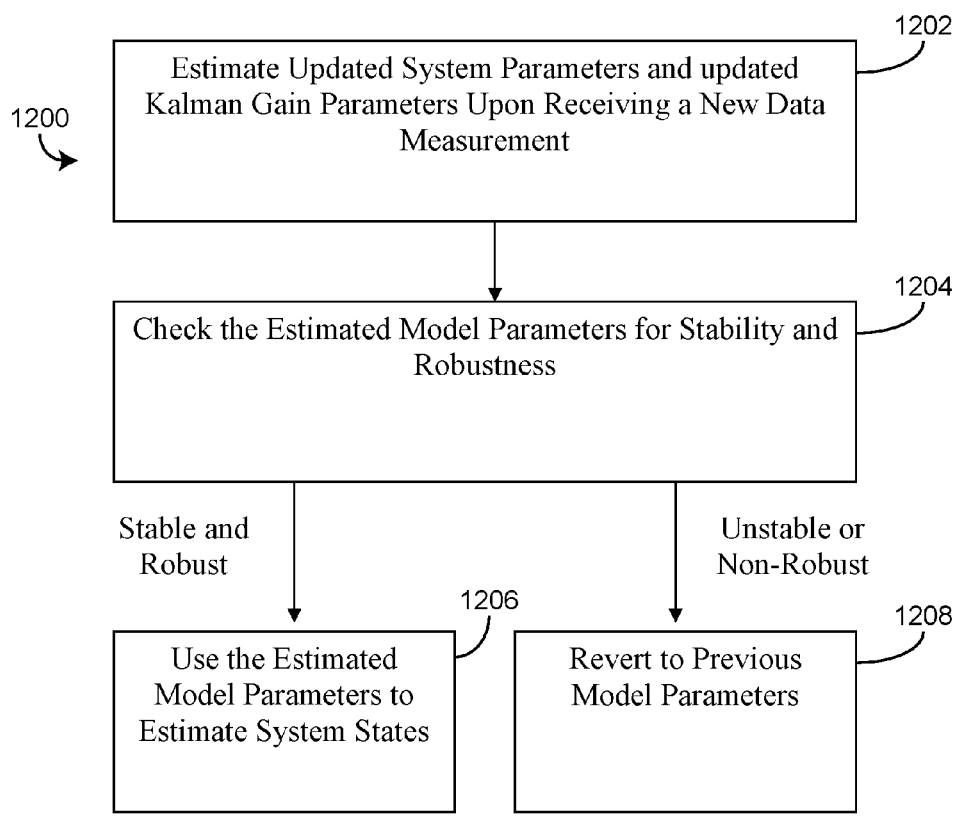
FIG. 9 is a flowchart of a process for recursively identifying updated model parameters and checking the updated model parameters for stability and robustness, according to an exemplary embodiment.

Referring now to FIG. 9, a flowchart of a process 1200 to recursively identify model parameters is shown, according to an exemplary embodiment. Recursive system identification has several advantages over batch system identification. For example, in recursive identification, the current knowledge of system parameters may be stored in an identifier "state" which is used to determine the current estimate. The state of the identification algorithm may be updated, and the estimate recalculated, each time a new measurement is obtained. Because recursive identification allows the estimate to be updated with each new measurement, memory requirements may be significantly reduced as it is not required to store each measurement in memory. Additionally, computational time may be significantly reduced because a large number of optimization iterations are no longer required with every measurement.

Another advantage of recursive identification is adaptability. For example, a recursive identification process may be able to compensate for slowly changing system parameters and may overcome the difficulty in modeling a changing physical world. In the exemplary embodiment, model inaccuracies may be anticipated and the model may be adjusted recursively through feedback and weighting functions. Initial parameter values and system state values may be determined by the batch processing method 1100 previously disclosed or otherwise received from any other source.

Still referring to FIG. 9, process 1200 may include estimating updated values for the model parameters (e.g., the system parameters and/or the Kalman gain parameters, a subset of the system parameters and/or the Kalman gain parameters known to be more likely to change, etc.) each time a new data measurement is received (step 1202), checking the estimated model parameters for stability and robustness (step 1204), and either using the estimated model parameters to estimate system states (step 1206), or reverting to previous model parameters (1208).

In the exemplary embodiment, step 1202 may include using an estimation process inspired by the extended Kalman filter (EKF). The following derivation adapts the EKF to a generalized case of a multiple-input multiple-output (MIMO) system for use in process 1200. For example, the model parameters $\theta$ may be estimated using the following EKF equations:

$$\hat{\theta}(k+1) = \hat{\theta}(k) + L(k)[y(k) - \hat{y}(k|k-1)],$$

$$L(k) = P_\theta(k)\mathcal{C}^T(k)[\mathcal{C}(k)P_\theta(k)\mathcal{C}^T(k) + R]^{-1},$$

$$P_\theta(k+1) = P_\theta(k) + Q_P + L(k)[\mathcal{C}(k)P_\theta(k)\mathcal{C}^T(k) + R]L^T(k),$$

where the state update matrix is the identity matrix and $P_\theta(k)$ is the parameter estimation error covariance. To calculate the time varying equivalent to the measurement equation, C, for the EKF, the generic update equation for normal distributions may be used, as shown in the following equations:

$$\hat{\theta}(k+1) = \hat{\theta}(k) + \Sigma_{\theta\omega}\Sigma_{\omega\omega}^{-1}[y(k) - \hat{y}(k|k-1)],$$

$$P_\theta(k+1) = P_\theta(k) + Q_P + \Sigma_{\theta\omega}\Sigma_{\omega\omega}^{-1}\Sigma_{\theta\omega}^T$$

$$\Sigma_{\theta\omega} = E\{[\theta(k) - \hat{\theta}(k)][y(k) - \hat{y}(k|k-1)]^T\},$$

$$\Sigma_{\omega\omega} = E\{[y(k) - \hat{y}(k|k-1)][y(k) - \hat{y}(k|k-1)]^T\}.$$

where $\Sigma_{\theta\omega}$ and $\Sigma_{\omega\omega}$ are the cross covariance between the parameter estimation error and the output estimation error and the covariance of the output estimation error, respectively. To calculate these to covariance matrices recursively and obtain the EKF equations shown above, the actual measurement may be approximated linearly as:

$$y(k) \approx C(\hat{\theta}(k)) \cdot \hat{x}(k|k-1) + D(\hat{\theta}(k)) \cdot u(k) + \mathcal{C}'\bigg|_{\substack{x=\hat{x}\\\theta=\hat{\theta}}}(\theta(k) - \hat{\theta}(k)) + w(k).$$

Using this linear approximation, the covariances $\Sigma_{\theta\omega}$ and $\Sigma_{\omega\omega}$ can be approximated as follows:

$$\sum_{\theta\omega} = E\{[\theta(k) - \hat{\theta}(k)][y(k) - \hat{y}(k|k-1)]^T\}$$

$$\sum_{\theta\omega} = E\left\{[\theta(k) - \hat{\theta}(k)]\left[\mathcal{C}'\bigg|_{\substack{x=\hat{x}\\\theta=\hat{\theta}}}(\theta(k) - \hat{\theta}(k)) + w(k)\right]^T\right\},$$

-continued $$\sum_{\theta\omega} = P_\theta \mathcal{C}^T \bigg|_{\substack{x=\hat{x}\\\theta=\hat{\theta}}},$$

$$\sum_{\omega\omega} = E\{[y(k)-\hat{y}(k\mid k-1)][y(k)-\hat{y}(k\mid k-1)]^T\},$$

$$\sum_{\omega\omega} = E\left\{\left[\mathcal{C}'_{\substack{x=\hat{x}\\\theta=\hat{\theta}}}(\theta(k)-\hat{\theta}(k))+w(k)\right]\left[\mathcal{C}'_{\substack{x=\hat{x}\\\theta=\hat{\theta}}}(\theta(k)-\hat{\theta}(k))+w(k)\right]^T\right\},$$

$$\sum_{\omega\omega} = \mathcal{C}'_{\substack{x=\hat{x}\\\theta=\hat{\theta}}} P_\theta \mathcal{C}^T \bigg|_{\substack{x=\hat{x}\\\theta=\hat{\theta}}} + R.$$

and used to update the parameter estimates in the EKF equations shown above.

In the exemplary embodiment, $\mathcal{C}$ may be resolved by assuming that the state estimate is equal to the actual state for a given parameter value. While this may not be true due to noise in the system, it may asymptotically true in terms of the expected parameter values. Because the system state estimates are also functions of the model parameters, $\mathcal{C}$ can then be written as, $$\mathcal{C}'(\theta; k) = \frac{d}{d\theta}[C(\theta)\cdot \hat{x}(\theta; k\mid k-1) + D(\theta)\cdot u(k)],$$

and using the product rule, as:

$$\mathcal{C}'(\theta; k) = C(\theta)\frac{d}{d\theta}\hat{x}(\theta; k\mid k-1) +$$

$$\left[\frac{dC}{d\theta_1}\hat{x}(\theta; k\mid k-1) \; \frac{dC}{d\theta_2}\hat{x}(\theta; k\mid k-1) \; \ldots \; \frac{dC}{d\theta_d}\hat{x}(\theta; k\mid k-1)\right] +$$

$$\left[\frac{dD}{d\theta_1}u(k) \; \frac{dD}{d\theta_1}u(k) \; \ldots \; \frac{dD}{d\theta_2}u(k)\right],$$

$$\mathcal{C}'(\theta; k) = C(\theta)\eta(\theta; k) + \mathcal{D}(\theta; \hat{x}, u; k).$$

In the exemplary embodiment, the derivatives of the matrices C and D may be determined by the model parameters, whereas the derivative of the state estimate η may be estimated recursively using in the following equation:

$$\eta(\theta; k+1) = \frac{d}{d\theta}\hat{x}(\theta; k+1\mid k)$$

$$= \frac{d}{d\theta}[A(\theta)\hat{x}(\theta; k\mid k-1) + B(\theta)u(k) + K(\theta)\varepsilon(k)],$$

$$= A(\theta)\eta(\theta; k) - K(\theta)\mathcal{C}'(\theta; k) +$$

$$\left[\frac{dA}{d\theta_1}\hat{x}(\theta; k\mid k-1) \; \frac{dA}{d\theta_2}\hat{x}(\theta; k\mid k-1) \ldots\right.$$

$$\left.\frac{dA}{d\theta_d}\hat{x}(\theta; k\mid k-1)\right] +$$

$$\left[\frac{dB}{d\theta_1}u(k) \; \frac{dB}{d\theta_2}u(k) \; \ldots \; \frac{dB}{d\theta_d}u(k)\right] +$$

$$\left[\frac{dK}{d\theta_1}\varepsilon(k) \; \frac{dK}{d\theta_2}\varepsilon(k) \; \ldots \; \frac{dK}{d\theta_d}\varepsilon(k)\right].$$

$$= A(\theta)\eta(\theta; k) - K(\theta)\mathcal{C}'(\theta; k) + \mathcal{H}(\theta; \hat{x}, u; k) + \mathcal{H}_\varepsilon(\theta; \varepsilon; k)$$

where, $$\varepsilon(k) \equiv y(k) - \hat{y}(k\mid k-1)$$

Therefore, recursive system identification process 1200 may use the following restated equations to estimate updated values for the model parameters each time a new measurement is obtained (step 1202):

$$\hat{y}(k\mid k-1) = C(\hat{\theta}(k))\hat{x}(k\mid k-1) + D(\hat{\theta}(k))u(k)$$

$$\varepsilon(k) = y(k) - \hat{y}(k\mid k-1)$$

$$\mathcal{C}'(k) = C(\hat{\theta}(k))\eta(k) + \mathcal{D}(\hat{\theta}(k); \hat{x}, u; k)$$

$$L(k) = P_\theta(k)\mathcal{C}'^T(k)[\mathcal{C}'(k)P_\theta(k)\mathcal{C}'^T(k) + R]^{-1}$$

$$\hat{\theta}(k+1) = \hat{\theta}(k) + L(k)\varepsilon(k)$$

Process 1200 may further include includes using the updated model parameters to estimate the system states (step 1206). An EKF could be developed to estimate both the system states and the model parameters simultaneously; however, this configuration may not converge if the noise properties of the system are unknown. Therefore, in an exemplary embodiment, system states may be estimated using a Kalman gain which is dependent on the model parameters according to the following difference equations:

$$\hat{x}(k+1\mid k) = A(\hat{\theta}(k))\hat{x}(k\mid k-1) + B(\hat{\theta}(k))u(k) + K(\hat{\theta}(k))\varepsilon(k),$$

$$P_\theta(k+1) = P_\theta(k) + Q_P + L(k)[\mathcal{C}'(k)P_\theta(k)\mathcal{C}'^T(k) + R]L^T(k),$$

$$\eta(k+1) = A(\hat{\theta}(k))\eta(k) - K(\hat{\theta}(k))\mathcal{C}'(k) + \mathcal{H}(\hat{\theta}(k); \hat{x}, u; k) + \mathcal{H}_\varepsilon(\hat{\theta}(k); \varepsilon; k)$$

which follow from the derivation above.

Still referring to FIG. 9, process 1200 may further include checking the estimated model parameters for stability and robustness (step 1204) and reverting to previous model parameters if the estimated model parameters are either unstable or non-robust (step 1208). In the exemplary embodiment, step 1204 may be accomplished using the estimated model parameters to update the difference equations shown above and then checking the updated equations for stability. The difference equations may be stable if, for the domain $\mathcal{S}$, the parameters are such that the eigenvalues of A−KC are strictly less than one. In other words:

$$\theta \in \mathcal{S} \subset \Re^d \text{ iff eig}\{A(\theta) - K(\theta)C(\theta)\} < 1$$

Thus, to keep the difference equations stable, the parameter update equation may be replaced with:

$$\hat{\theta}(k+1) = \begin{cases} \hat{\theta}(k) + L(k)\varepsilon(k), & \hat{\theta}(k) + L(k)\varepsilon(k) \in \mathcal{S} \\ \hat{\theta}(k), & \hat{\theta}(k) + L(k)\varepsilon(k) \notin \mathcal{S} \end{cases}$$

Therefore, in some embodiments, the model parameters are not updated (step 1208) (e.g., the estimated value is not used and the parameters revert to their previous values) if the estimated values would result in instability.

Advantageously, process 1200 achieves improved robustness by considering the effect of outlying raw data. For example, for a squared error cost function, the gradient of the cost function (at a given sample) may be stated as $-\mathcal{C}'\varepsilon$. Thus, process 1200 may be a modified descent process in which the EKF equations (e.g., the parameter update equations used in step 1202) are used to scale and modify the direction of the descent. For example, the gradient of the cost function may be stated as:

$$\nabla J_\varepsilon = -\mathcal{C}(k)\frac{dl}{d\theta},$$

which when applied to the following cost function, becomes:

$$l[e(k)] = \begin{cases} c^2\sigma^2 & e(k) < -c\sigma \\ e^2(k) & -c\sigma < e(k) < c\sigma \\ c^2\sigma^2 & e(k) > c\sigma \end{cases} \rightarrow \nabla J_\varepsilon = \begin{cases} 0 & \varepsilon(k) < -c\sigma \\ -\mathcal{C}(k)\varepsilon(k) & -c\sigma < \varepsilon(k) < c\sigma \\ 0 & \varepsilon(k) > c\sigma \end{cases}$$

Thus, in process 1200 the parameter set may not be updated (step 1208) if the output estimation error is large (e.g., exceeds a threshold defined by cσ).

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A controller for a building system, the controller comprising:
    a communications interface configured to receive training data comprising input data and output data, the output data indicative of a state of the building system affected by both the input data and an extraneous disturbance comprising an uncontrolled input to the building system; and
    a processing circuit comprising a processor and memory, wherein the processing circuit is configured to perform a two-stage optimization process to identify system parameters and Kalman gain parameters of a dynamic model for the building system, the two-stage optimization process comprising:
        a first stage in which the processing circuit is configured to filter the training data to remove an effect of the extraneous disturbance from the output data and uses the filtered training data to identify the system parameters, and
        a second stage in which the processing circuit is configured to use the non-filtered training data to identify the Kalman gain parameters;
    wherein the processing circuit is configured to use the dynamic model to generate a setpoint for the building system and the building system is configured to use the setpoint to affect the state indicated by the output data.

2. The controller of claim 1, wherein the extraneous disturbance comprises an uncontrolled thermal input to the building system.

3. The controller of claim 1, wherein the system parameters describe energy transfer characteristics of the building system and are independent of the extraneous disturbance.

4. The controller of claim 1, wherein the Kalman gain parameters account for the extraneous disturbance.

5. The controller of claim 1, wherein the state of the building system comprises at least one of a temperature of the building system, a power use of the building system, a humidity of the building system, an enthalpy of the building system, and a flow rate within the building system.

6. The controller of claim 1, wherein the dynamic model is a physics-based parameterization of the building system.

7. The controller of claim 1, wherein the first stage of the two-stage optimization process comprises:
    filtering the input data to create filtered input data and filtering the output data to create filtered output data;
    generating model-predicted filtered output data based on a set of estimated system parameters and the filtered input data;
    generating a first error cost function that defines a first error cost based on a difference between the filtered output data and the model-predicted filtered output data;
    adjusting the estimated system parameters to minimize the first error cost.

8. The controller of claim 1, wherein:
    the extraneous disturbance comprises a slowly changing disturbance to the building system; and the processing circuit is configured to filter the training data using a high-pass filter to remove an effect of the slowly changing disturbance from the output data.

9. The controller of Claim 7, wherein the second stage of the two-stage optimization process comprises:
generating model-predicted output data based on a set of estimated Kalman gain parameters and the non-filtered input data;
generating a second error cost function that defines a second error cost based on a difference between the output data and the model-predicted output data;
adjusting the estimated Kalman gain parameters to minimize the second error cost.

10. The controller of claim 1, wherein the processing circuit identifies the Kalman gain parameters during the second stage of the two-stage optimization process while holding the system parameters at constant values identified during the first stage of the two-stage optimization process.

11. A controller for a building system, the controller comprising:
a communications interface configured to receive training data comprising input data and output data, the output data indicative of a state of the building system affected by both the input data and an extraneous disturbance comprising an uncontrolled input to the building system; and
a processing circuit comprising a processor and memory, wherein the processing circuit is configured to perform a two-stage optimization process to identify parameters of a dynamic model for the building system, the two-stage optimization process comprising:
a first stage in which the processing circuit is configured to identify system parameters of the dynamic model, and
a second stage in which the processing circuit is configured to identify Kalman gain parameters of the dynamic model while holding the system parameters at constant values identified during the first stage;
wherein the processing circuit is configured to use the dynamic model to generate a setpoint for the building system and the building system is configured to use the setpoint to affect the state indicated by the output data.

12. The controller of claim 11, wherein:
the extraneous disturbance comprises a slowly changing disturbance to the building system; and
the processing circuit is configured to filter the training data using a high-pass filter to remove an effect of the slowly changing disturbance from the output data.

13. The controller of claim 11, wherein the extraneous disturbance comprises an uncontrolled thermal input to the building system.

14. The controller of claim 11, wherein the first stage of the two-stage optimization process comprises:
filtering the training data to remove an effect of the extraneous disturbance from the output data; and
using the filtered training data to identify the system parameters.

15. The controller of claim 11, wherein the system parameters describe energy transfer characteristics of the building system and are independent of the extraneous disturbance.

16. The controller of claim 11, wherein:
the Kalman gain parameters account for the extraneous disturbance; and
the second stage of the two-stage optimization process comprises using non-filtered training data to identify the Kalman gain parameters.

17. The controller of claim 11, wherein the state of the building system comprises at least one of a temperature of the building system, a power use of the building system, a humidity of the building system, an enthalpy of the building system, and a flow rate within the building system.

18. A computer-implemented method for identifying parameters of a dynamic model for a building system, the method comprising:
receiving, at a controller for the building system, training data comprising input data and output data, the output data indicative of a state of the building system affected by both the input data and an extraneous disturbance comprising an uncontrolled input to the building system;
performing, by the controller, a two-stage optimization process to identify system parameters and Kalman gain parameters of the dynamic model, the two-stage optimization process comprising:
a first stage in which the controller filters the training data to remove an effect of the extraneous disturbance from the output data and uses the filtered training data to identify the system parameters, and
a second stage in which the controller uses the non-filtered training data to identify the Kalman gain parameters; and
using the dynamic model to generate, by the controller, a setpoint for the building system, wherein the building system is configured to use the setpoint to affect the state indicated by the output data.

19. The method of claim 18, wherein the state of the building system comprises at least one of a temperature of the building system, a power use of the building system, a humidity of the building system, an enthalpy of the building system, and a flow rate within the building system.

20. The method of claim 18, wherein:
the system parameters describe energy transfer characteristics of the building system and are independent of the extraneous disturbance; and
the Kalman gain parameters account for the extraneous disturbance.

* * * * *

UNITED STATES PATENT AND TRADEMARK OFFICE
CERTIFICATE OF CORRECTION

PATENT NO. : 10,088,814 B2
APPLICATION NO. : 14/970187
DATED : October 2, 2018
INVENTOR(S) : Michael J. Wenzel and Robert D. Turney It is certified that error appears in the above-identified patent and that said Letters Patent is hereby corrected as shown below:

In the Specification

Column 1, Line 47 Insert the following between the Background and Summary sections:
-- GOVERNMENT LICENSE RIGHTS
This invention was made with government support under contract number DE-EE0003982, awarded by the U.S. Department of Energy. The government has certain rights in the invention. --

Signed and Sealed this
Twentieth Day of January, 2026

John A. Squires
*Director of the United States Patent and Trademark Office*